United States Patent
Wessendorf

(10) Patent No.: US 11,456,701 B1
(45) Date of Patent: Sep. 27, 2022

(54) DUAL-MODE OSCILLATOR FOR STRESS COMPENSATED CUT RESONATOR

(71) Applicant: National Technology & Engineering Solutions of Sandia, LLC, Albuquerque, NM (US)

(72) Inventor: Kurt O. Wessendorf, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/666,014

(22) Filed: Feb. 7, 2022

Related U.S. Application Data

(60) Provisional application No. 63/155,841, filed on Mar. 3, 2021.

(51) Int. Cl.
*H03B 5/36* (2006.01)
*H03B 5/12* (2006.01)

(52) U.S. Cl.
CPC ........... *H03B 5/366* (2013.01); *H03B 5/1228* (2013.01); *H03B 5/1231* (2013.01); *H03B 2200/009* (2013.01)

(58) Field of Classification Search
CPC .... H03B 5/366; H03B 5/1228; H03B 5/1231; H03B 2200/009
USPC .............................. 331/158, 176, 116 FE, 46
See application file for complete search history.

(56) References Cited

U.S. PATENT DOCUMENTS 7,511,590 B1 * 3/2009 Gehring ................... H03B 5/36
331/46

* cited by examiner

*Primary Examiner* — Arnold M Kinkead
(74) *Attorney, Agent, or Firm* — Mark A. Dodd

(57) ABSTRACT

Both parallel-type and serial-type dual-mode oscillators employing stress compensated cut resonators having various configurations are disclosed. Both classes of dual-mode oscillators employ multiple tank circuits to pass one frequency of the resonator and block the other frequency. The tank circuits isolate the operation of the two oscillator sub-circuits that form the dual-mode oscillator from one another. The dual-mode oscillators may be implemented with either bipolar or CMOS transistors. The parallel-type dual-mode oscillators employ inverters to provide gain. The serial-type dual-mode oscillators employ a two (or three) stage design including a follower circuit first stage and an inverting amplifier/limiter circuit second stage, with an optional intervening transimpedance amplifier stage.

20 Claims, 17 Drawing Sheets

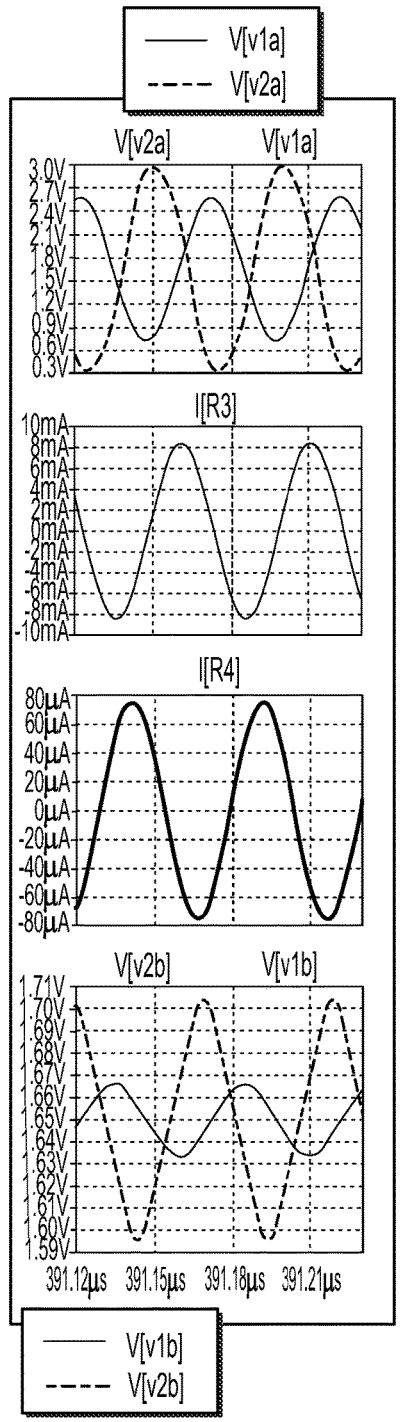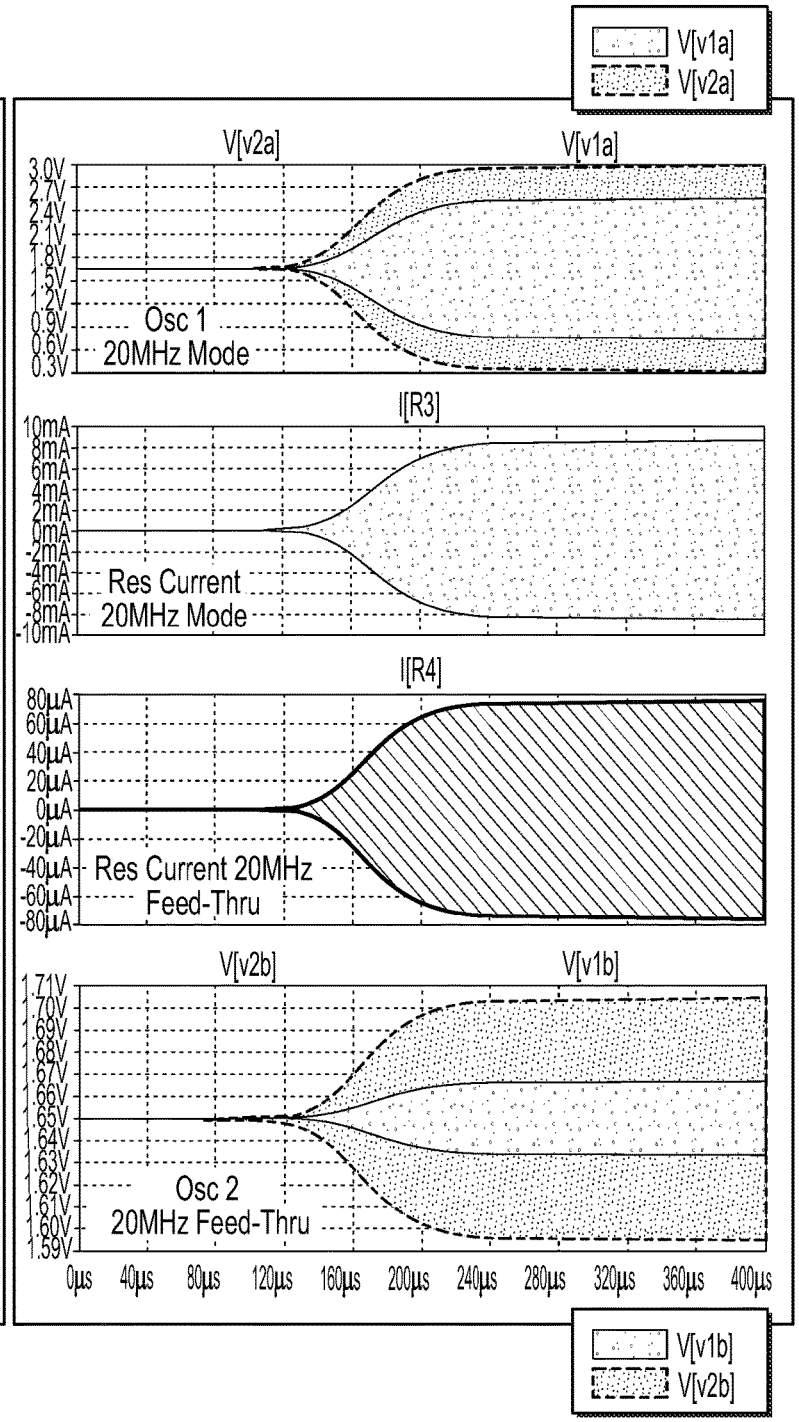
FIG. 8A  FIG. 8B

DUAL-MODE OSCILLATOR FOR STRESS COMPENSATED CUT RESONATOR

RELATED APPLICATIONS

This application claims priority to U.S. Provisional Application No. 63/155,841, filed on Mar. 3, 2021, and entitled DUAL-MODE OSCILLATOR FOR STRESS COMPENSATED CUT RESONATOR, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a dual-mode oscillator, i.e., a device that generates two frequencies from two distinct modes from a single resonator, in which the interaction between the modes is minimized.

BACKGROUND

Various applications require two operating frequencies derived from two corresponding modes in a single resonator. Oscillators operating on these two modes to generate the two corresponding frequencies are termed dual-mode oscillators. Ideally, the two oscillator sub-circuits within the dual-mode oscillator have minimal co-interaction between the two desired modes of the single resonator. Further, both modes ideally have high loaded quality or Q values.

The resonator used in dual-mode oscillators are typically of the stress compensated (SC) type with B and C modes, with the frequency of the B mode typically approximately 10% greater than the frequency of the C mode. In some dual-mode oscillators, an overtone of one of the frequencies, for example 3× or 5× the fundamental may be employed. The two modes have vastly different temperature responses, with the C mode exhibiting a classic cubic temperature frequency response, for example, in the low 10 ppm range over the temperature range of 0° C. to 70° C. In contrast, the B mode has a very steep linear temperature frequency response, approximately −26 ppm per ° C. One can then use the linear temperature frequency response of the B mode to counter the temperature dependence of the C mode, which is traditionally the main mode. These types of dual-mode oscillators may be used, for example, in self-measuring frequency applications.

Prior art solutions traditionally use bridge-type oscillators designs. Bridge-type oscillator designs are both difficult to design and to obtain sufficient separation of the modes between the two oscillator sub-circuits, especially when the frequencies are closely spaced.

Thus, a need exists for a dual-mode oscillator that can be implemented in CMOS and bipolar technologies with reduced interaction, i.e., greater isolation, between the modes of the two oscillator sub-circuits.

SUMMARY

One aspect of the present invention relates to a parallel-type dual-mode oscillator that employs a pair of oscillator sub-circuits and a common SC cut resonator shared by the oscillator sub-circuits. The parallel-type dual-mode oscillator includes a total of five tank circuits, with two of the tank circuits in each of the oscillator sub-circuits and the fifth tank circuit in parallel with the SC cut resonator. The SC cut resonator resonates at a lower frequency F1 and an upper frequency F2. The tank circuits in the first oscillator sub-circuit pass the lower frequency F1 while blocking the upper frequency F2. Conversely, the tank circuits in the second oscillator sub-circuit pass the upper frequency F2 while blocking the lower frequency F1. The fifth tank circuit in parallel with the SC cut resonator broadly resonates at both the lower frequency F1 and the upper frequency F2 and serves to dampen non-resonator modes, for example, those caused by the oscillator sub-circuits and the resonator shunt capacitance $C_0$.

Another aspect of the present invention relates to a serial-type dual-mode oscillator that employs a pair of oscillator sub-circuits and a common SC cut resonator shared by the oscillator sub-circuits. The serial-type dual-mode oscillator includes a total of four tank circuits, with two of the tank circuits in each of the oscillator sub-circuits. Each of the oscillator sub-circuits also includes a follower circuit and an amplifier/limiter circuit. The oscillator operates at a lower frequency F1 and an upper frequency F2 of the resonator, with a parasitic frequency F3 being approximately the average of the lower frequency F1 and the upper frequency F2. The tank circuit in the first oscillator sub-circuit connected to the SC cut resonator passes the lower frequency F1 while blocking the upper frequency F2. The tank circuit in the first oscillator sub-circuit connected to the output of the amplifier/limiter circuit and ground allows gain at frequency F1, while shunting the parasitic frequency F3 to ground. The tank circuit in the second oscillator sub-circuit connected to the SC cut resonator passes the upper frequency F2 while blocking the lower frequency F1. The tank circuit in the second oscillator sub-circuit connected to the output of the amplifier/limiter circuit and ground allows gain at frequency F2, while shunting the parasitic frequency F3 to ground.

In at least one embodiment of the present invention, a parallel-type dual-mode oscillator comprises a resonator (the resonator resonating at a lower frequency F1 and an upper frequency F2), a first oscillator sub-circuit operating at the lower frequency F1 [the first oscillator sub-circuit includes a first input tank circuit (the first input tank circuit coupled to the resonator, the first input tank circuit passing the lower frequency F1 and blocking the upper frequency F2), a first inverter (the first inverter coupled to the first input tank circuit, the first inverter inverting a signal from the first input tank circuit), and a first output tank circuit (the first output tank circuit coupled to the first inverter and the resonator, the first output tank circuit passing the lower frequency F1 and blocking the upper frequency F2)], a second oscillator sub-circuit operating at the upper frequency F2 [the second oscillator sub-circuit includes a second input tank circuit (the second input tank circuit coupled to the resonator, the second input tank circuit passing the upper frequency F2 and blocking the lower frequency F1), a second inverter (the second inverter coupled to the second input tank circuit, the second inverter inverting a signal from the second input tank circuit), and a second output tank circuit (the second output tank circuit coupled to the second inverter and the resonator, the second output tank circuit passing the upper frequency F2 and blocking the lower frequency F1)]; and a third tank circuit (the third tank circuit coupled to the resonator in parallel, the third tank circuit in parallel with the resonator having a capacitive impedance at the lower frequency F1 and at the upper frequency F2).

In other parallel-type dual-mode oscillator embodiments of the present invention, the first input tank circuit and the first output tank circuit each includes a first leg in parallel with a second leg, the first leg including in series a first capacitor and a first inductor, and the second leg including in series a second capacitor and a second resistor; a series combination of the first capacitor and the first inductor resonating at the lower frequency F1 and a series combination of the first capacitor and the first inductor in parallel with the second capacitor resonating at the upper frequency F2; the second input tank circuit and the second output tank circuit each includes a first leg in parallel with a second leg, the first leg including in series a first capacitor and a first inductor, and the second leg including in series a second inductor and a second resistor; a series combination of the first capacitor and the first inductor resonating at the upper frequency F2 and a series combination of the first capacitor and the first inductor in parallel with the second inductor resonating at the lower frequency F1; and the second leg further includes a second capacitor in parallel with the second inductor.

In yet other parallel-type dual-mode oscillator embodiments of the present invention, the third tank circuit includes in series a first inductor and a first resistor; one or more of the first input tank circuit, the first output tank circuit, the second input tank circuit, or the second output tank circuit includes a trimmable capacitor; and the upper frequency F2 is within approximately 10% of the lower frequency F1 or the upper frequency F2 is an odd integer multiple of the lower frequency F1.

In at least one embodiment of the present invention, a serial-type dual-mode oscillator comprises a resonator (the resonator resonating at a lower frequency F1 and an upper frequency F2, a parasitic frequency F3 corresponding approximately to an average of the lower frequency F1 and the upper frequency F2), a first oscillator sub-circuit operating at the lower frequency F1 [the first oscillator sub-circuit includes a first tank circuit (the first tank circuit coupled to the resonator, the first tank circuit passing the lower frequency F1 and blocking the upper frequency F2), a first follower circuit (the first follower circuit including a first node coupled to the first tank circuit, a second node, and a third node), a third tank circuit (the third tank circuit coupled between the second node of the first follower circuit and ground, the third tank circuit allowing amplifier/limiter gain at the lower frequency F1 and shunting the parasitic frequency F3 to ground), and a first inverting amplifier/limiter circuit (the first inverting amplifier/limiter circuit coupled between the second node of the first follower circuit and the third node of the first follower circuit, the first inverting amplifier/limiter circuit amplifying and limiting a signal at the third node of the first follower circuit)], a second oscillator sub-circuit operating at the upper frequency F2 [the second oscillator sub-circuit includes a second tank circuit (the second tank circuit coupled to the resonator, the second tank circuit passing the upper frequency F2 and blocking the lower frequency F1), a second follower circuit (the second follower circuit including a first node coupled to the second tank circuit, a second node, and a third node), a fourth tank circuit (the fourth tank circuit coupled between the second node of the second follower circuit and ground, the fourth tank circuit allowing amplifier/limiter gain at the upper frequency F2 and shunting the parasitic frequency F3 to ground)], and a second inverting amplifier/limiter circuit (the second inverting amplifier/limiter circuit coupled between the second node of the second follower circuit and the third node of the second follower circuit, the second inverting amplifier/limiter circuit amplifying and limiting a signal at the third node of the second follower circuit).

In other serial-type dual-mode oscillator embodiments of the present invention, the first tank circuit and the fourth tank circuit each includes a first leg in parallel with a second leg, the first leg including in series a first capacitor and a first inductor, and the second leg including in series a second capacitor and a second resistor; for the first tank circuit, a series combination of the first capacitor and the first inductor resonating at the lower frequency F1 and a series combination of the first capacitor and the first inductor in parallel with the second capacitor resonating at the upper frequency F2; and for the fourth tank circuit, a series combination of the first capacitor and the first inductor resonating at the parasitic frequency F3 and a series combination of the first capacitor and the first inductor in parallel with the second capacitor resonating at the upper frequency F2.

In yet other serial-type dual-mode oscillator embodiments of the present invention, the second tank circuit and the third tank circuit each includes a first leg in parallel with a second leg, the first leg including in series a first capacitor and a first inductor, and the second leg including in series a second inductor and a second resistor; for the second tank circuit, a series combination of the first capacitor and the first inductor resonating at the upper frequency F2 and a series combination of the first capacitor and the first inductor in parallel with the second capacitor resonating at the lower frequency F1; for the third tank circuit, a series combination of the first capacitor and the first inductor resonating at the parasitic frequency F3 and a series combination of the first capacitor and the first inductor in parallel with the second capacitor resonating at the lower frequency F1; and the second leg further includes a second capacitor in parallel with the second inductor.

In still serial-type dual-mode oscillator embodiments of the present invention, each of the first follower circuit and the second follower circuit includes one of a bipolar transistor follower circuit, a metal oxide semiconductor field effect transistor (MOSFET) follower circuit, or a compound-transistor follower circuit (the compound-transistor follower circuit including a first MOSFET of a first type having an $M_{P1}=1$, a second MOSFET of the first type having an $M_{P2}>1$, and a third MOSFET of a second type opposite the first type; the first inverting amplifier/limiter circuit and the second inverting amplifier/limiter circuit each includes a corresponding transimpedance amplifier, and one or more of the first tank circuit, the second tank circuit, the third tank circuit, or the fourth tank circuit includes a trimmable capacitor; and the upper frequency F2 is within approximately 10% of the lower frequency F1 or the upper frequency F2 is an odd integer multiple of the lower frequency F1).

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 1A illustrates a model for a single mode of an SC cut resonator that may be used in one or more embodiments of the present invention, while

FIGS. 8A and 8B illustrate the voltages and currents at various points in a parallel-type dual-mode oscillator in accordance with the first class of embodiments of the present invention at steady state and start-up, respectively.

DETAILED DESCRIPTION

SC Cut Resonator

Figure 1A:
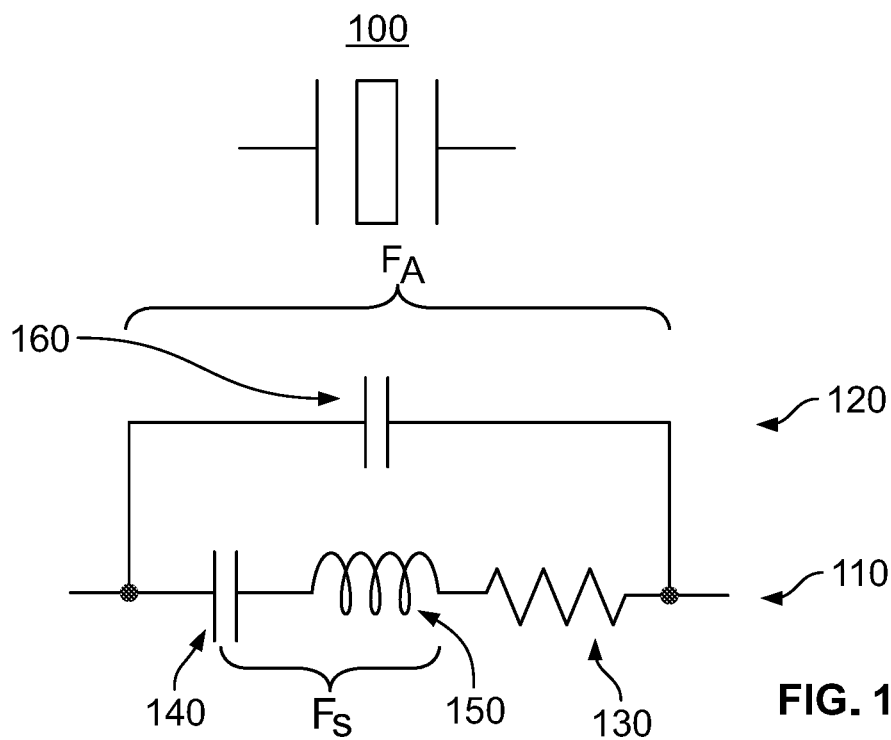

A single mode within an SC cut resonator 100 may be modeled as illustrated in FIG. 1A. While all crystal resonators have multiple modes, the SC cut resonator has useful modes spaced both closely together at fundamental and overtone (odd multiples of a fundamental mode) frequencies. The model elements for a single mode within the SC cut resonator 100 include a motional leg 110 based on a piezoelectric model and a static capacitance leg 120. The motional leg 110 includes a resistor 130 having a value $R_m$ corresponding to the resonator loss, a capacitor 140 having a value $C_m$ corresponding to the resonator mass, and an inductor 150 having a value $L_m$ corresponding to the compliance of the resonator. The motional leg 110 has a quality factor Q corresponding to $X_{Cm}$ or $X_{Lm}$ divided by $R_m$. The static capacitance leg 120 includes a shunt capacitor 160 having a value $C_0$ due to the electrode plating and packaging capacitance. A model for multiple modes within a single SC cut resonator would include a motional leg for each mode of the resonator in parallel with each other and with the shunt capacitor 160. Because the Q is so high within the SC cut resonator, even modes with frequencies that are spaced 10% apart will not interfere with each other.

Figure 1B:
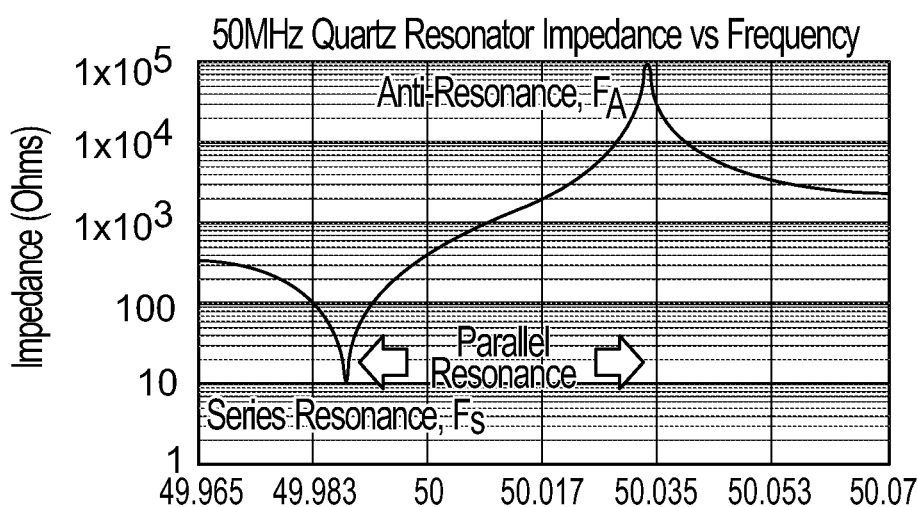
FIGS. 1B and 1C illustrate the impedance and phase for this single mode of the SC cut resonator.
Figure 1C:
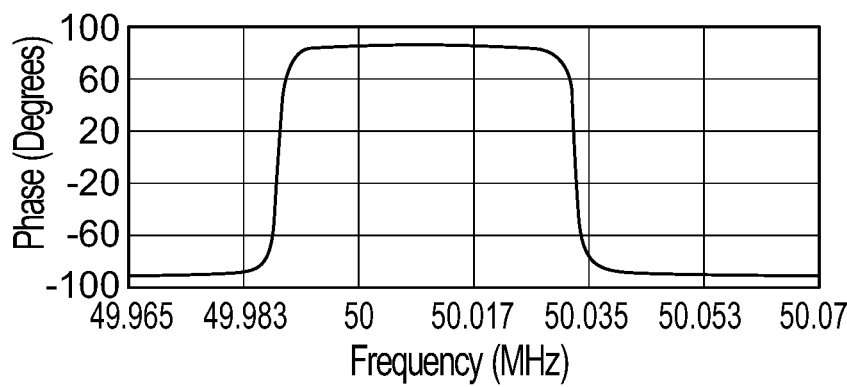

FIGS. 1B and 1C illustrate the impedance and phase of the SC cut resonator 100 as a function of frequency. The impedance and phase of the SC cut resonator 100 include two frequencies of interest. The first is the series resonance frequency, denoted as $F_S$, which corresponds to the resonance due to the series combination of the capacitor 140 and the inductor 150. The second is the anti-resonance frequency due to the series combination of the capacitor 140 and the inductor 150 in parallel with the shunt capacitor 160.

Parallel-Type Dual-Mode Oscillator

A first class of embodiments of the present invention employs a CMOS-implemented parallel-type dual-mode oscillator. This first class of embodiments employs commonly used CMOS inverters for the core of the two oscillator sub-circuits. The first class of embodiments uses dual-resonance tank circuits to couple the desired mode of the SC cut resonator to a respective one of the two oscillator sub-circuits while isolating the two oscillator sub-circuits from each other. The following describes two embodiments of this first class, with one embodiment employing a lower frequency and one overtone (3×) frequency for the two oscillator sub-circuits while the other embodiment employs two closely spaced (10%) frequencies for the two oscillator sub-circuits. While the following describes an overtone of a factor of 3, the overtone may be an odd integer multiple of the lower frequency.

Figure 2:
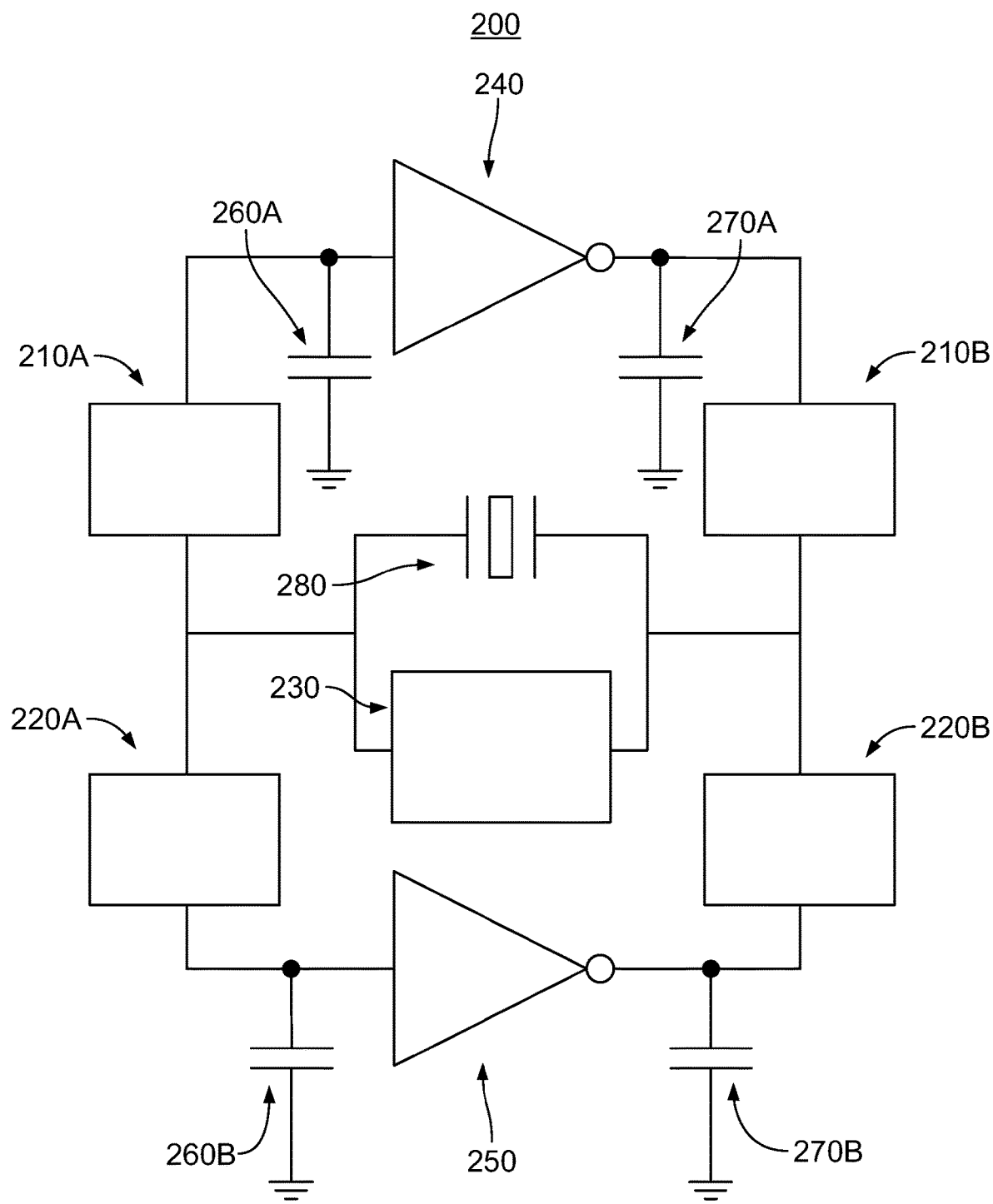
FIG. 2 illustrates a block diagram of a parallel-type dual-mode oscillator in accordance with a first class of embodiments of the present invention.

FIG. 2 illustrates a block diagram of a parallel-type dual-mode oscillator 200 in accordance with a first class of embodiments of the present invention. As illustrated in FIG. 2, the parallel-type dual-mode oscillator 200 includes a first pair of tank circuits 210A, 210B, a second pair of tank circuits 220A, 220B, and a third tank circuit 230. The dual-mode oscillator 200 further includes a first inverter 240, a second inverter 250, each with corresponding input pillar capacitors 260A, 260B and output pillar capacitors 270A, 270B. Lastly, the parallel-type dual-mode oscillator 200 includes an SC cut resonator 280 with two resonating frequencies F1 and F2, with F2>F1.

Figure 3A:
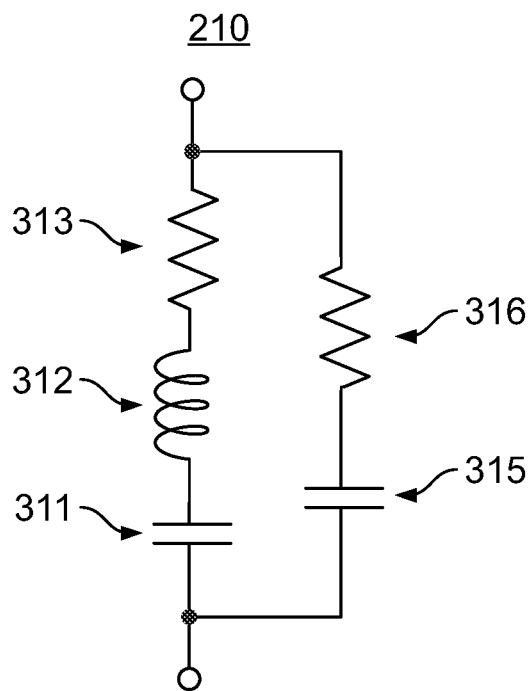
FIGS. 3A-3C illustrate tank circuits that may be used in one or more embodiments of a parallel-type dual-mode oscillator in accordance with the first class of embodiments of the present invention.

FIG. 3A illustrates a circuit schematic of the first tank circuits 210A, 210B. Each of the first tank circuits 210A, 210B has a low impedance at the lower frequency F1 of the SC cut resonator 280, thereby passing the lower frequency F1, and a high impedance at the upper frequency F2 of the SC cut resonator 280, thereby blocking the upper frequency F2. Each of the first tank circuits 210A, 210B includes two parallel legs with the pass leg comprising a first capacitor 311, a first inductor 312, and a parasitic resistance 313. The first capacitor 311 in series with the first inductor 312 have a series resonance at the lower frequency F1. The block leg comprises a second capacitor 315 and a second resistor 316. The series combination of the first capacitor 311 and the first inductor 312 in parallel with the second capacitor 315 have a parallel resonance frequency at the upper frequency F2. Note that an additional parasitic capacitance 414, illustrated in FIG. 4A, should be included for design and modeling purposes only. Further, the parasitic resistance 313 is not a separate or added component of the physically implemented first tank circuits 210A, 210B.

Figure 3B:
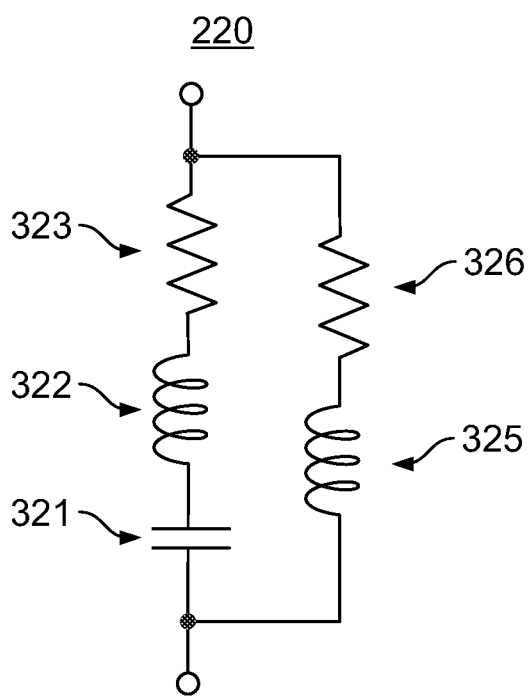

FIG. 3B illustrates a circuit schematic of the second tank circuits 220A, 220B. Each of the second tank circuits 220A, 220B has a low impedance at the upper frequency F2 of the SC cut resonator 280, thereby passing the upper frequency F2, and a high impedance at the lower frequency F1 of the SC cut resonator 280, thereby blocking the lower frequency F1. Each of the second tank circuits 220A, 220B includes two parallel legs with the pass leg comprising a first capacitor 321, a first inductor 322, and a parasitic resistance 323. The first capacitor 321 in series with the first inductor 322 have a series resonance at the upper frequency F2. The block leg comprises a second inductor 325 and a second resistor 326. The series combination of the first capacitor 321 and the first inductor 322 in parallel with the second inductor 325 have a parallel resonance frequency at the lower frequency F1. Note that an additional parasitic capacitance 424, illustrated in FIG. 4B, should be included for design and modeling purposes only. Further, the parasitic resistance 323 is not a separate or added component of the physically implemented second tank circuits 220A, 220B.

The design of the first and second tank circuits 210A, 210B, 220A, 220B allows dual tuning, with low impedance at the series resonance frequency and high impedance at the parallel resonance frequency. Tuning is preferably accomplished using laser trimmable capacitors, with the desired series resonance frequency tuned first, followed by the corresponding parallel resonance frequency, as described below.

As the parasitic resistances 313, 323 are effectively in series with the SC cut resonator 280, the parasitic resistances 313, 323 represent losses, primarily due to the first inductors 312, 322, and thus their values should be minimized by careful selection of the first inductors 312, 322. The losses due to the second resistors 316, 326 at the parallel resonance frequency need not be minimized but should be large enough to squelch non-resonator oscillation modes. For example, the parallel impedance at the parallel resonance frequency may be in the single digit kΩ range, such as approximately 5 kΩ.

Figure 3C:
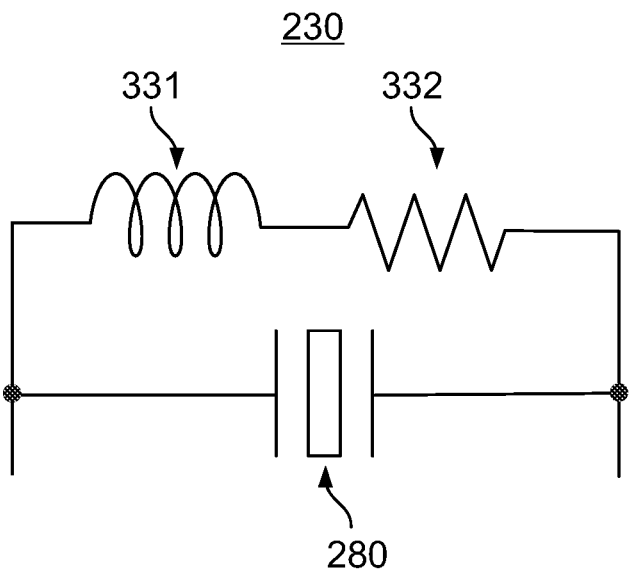

FIG. 3C illustrates a circuit schematic of the third tank circuit 230 in parallel with the SC cut resonator 280. The third tank circuit 230 is designed to squelch the non-resonator oscillation modes formed by the first and second tank circuits 210A, 210B, 220A, 220B and the shunt capacitor 160. The third tank circuit 230 has a relatively large (>1 kΩ), but capacitive, impedance at both the lower frequency F1 and the upper frequency F2 of the SC cut resonator 280 when the modes are closely spaced, for example 10%. The third tank circuit 230 includes an inductor 331 in series with a resistor 332. As illustrated in FIG. 2, the third tank circuit 230 is parallel to the SC cut resonator 280 and its capacitance $C_0$. The third tank circuit 230, with its series combination of the inductor 331 and the resistor 332, is designed to broadly resonate with the SC cut resonator 280 and its capacitance $C_0$ at a frequency just above the upper frequency F2 when the modes are closely spaced.

With the design of the parallel-type dual-mode oscillator 200, the strong L-C-L Pierce-like resonator modes will be at frequencies above the upper frequency F2 and below the lower frequency F1. While there may be no single or exact set of values for the various circuit components, one may use an empirical transient circuit analysis approach to iterate to a solution for a given application. Among the guiding principles to be used during this empirical transient circuit analysis is that one should maintain as much loaded Q at the modes of the SC cut resonator 280 as possible. A further goal during the empirical transient circuit analysis is to eliminate, or at least minimize, the non-resonator oscillation modes. If parasitic oscillation modes cannot be completely eliminated but require a greater transconductance in the first and second inverters 240, 250 than the desired resonator modes, one may use a long rise-time power supply voltage to only allow the desired resonator modes of operation.

When the upper frequency of the F2 of the SC cut resonator 280 is much greater than the lower frequency F1 of the SC cut resonator 280, for example a factor of 3× or 5×, the third tank circuit 230 has a relatively large, but capacitive, impedance at the upper frequency F2. In contrast, the third tank circuit 230 has a relatively real impedance at the lower frequency F1. The third tank circuit 230, with its inductor 331 and resistor 332, is designed to broadly resonate, i.e., have a low Q, with the SC cut resonator 280 and its capacitance $C_0$ at a frequency above, but close to, the upper frequency F2. Empirical transient circuit analysis may again be used to optimize the design of the third tank circuit 230 with the same goals of maintaining a high loaded Q at resonator frequencies and eliminating, or at least minimizing, the non-resonator oscillation modes.

Figure 4A:
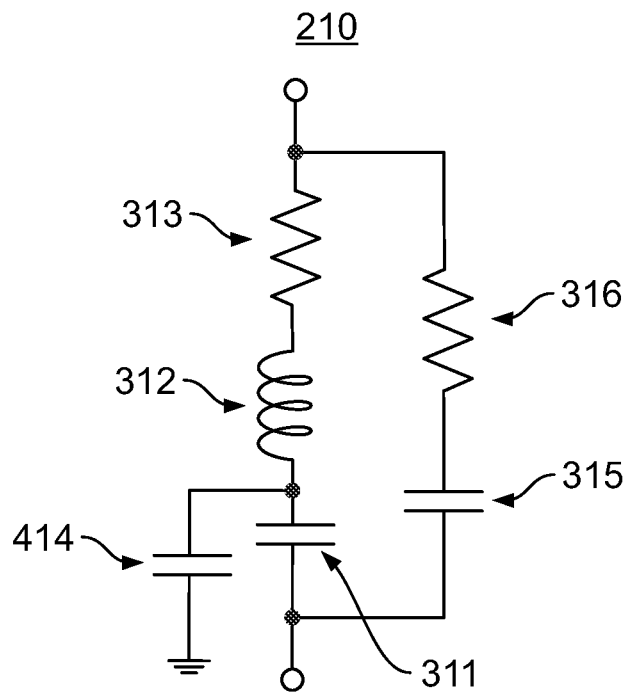
FIGS. 4A and 4B illustrate tank circuit models that may be used in the design of one or more embodiments of a parallel-type dual-mode oscillator in accordance with the first class of embodiments of the present invention.
Figure 4B:
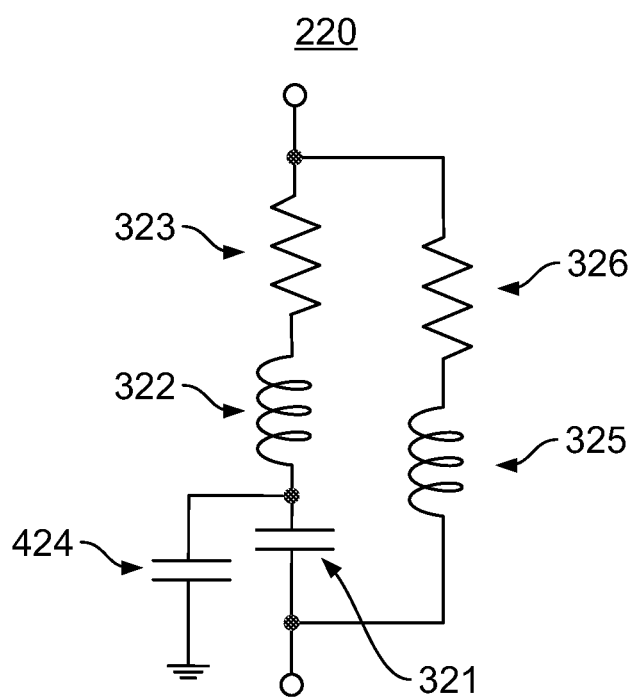

The following provides a description of one design methodology for designing the first and second tank circuits 210A, 210B, 220A, 220B using the models illustrated in FIGS. 4A and 4B. For a high Q at the pass frequency, one desires a small capacitance for the first capacitors 311, 321, a large inductance for the first inductors 312, 322, and a small resistance for the parasitic resistances 313, 323. FIGS.

4A and 4B illustrate the parasitic capacitances 414, 424 noted above. The parasitic capacitances 414, 424 may be set to 0.5 pF, which drives the minimum value of capacitance for the first capacitors 311, 321. As a starting point, one may set the capacitance for the first capacitors 311, 321 at a factor of ten greater than the parasitic capacitances 414, 424, i.e., 5.0 pF. At higher resonance frequencies, it is desirable to minimize the parasitic capacitances 414, 424 to allow for a smaller capacitance for the first capacitors 311, 321. The parasitic capacitances 414, 424 may be minimized by various means, including optimizing board pad/trace area, board thickness, and dielectric constant. A vertical point to point connection between the first capacitors 311, 321 and their corresponding first inductors 312, 322 may also help reduce the parasitic capacitances 414, 424. Once the capacitance for the first capacitors 311, 321 and the lower frequency F1 and the upper frequency F2 are determined, the inductance for the first inductors 312, 322 is fixed. With the upper frequency F2, the capacitance for the first capacitor 311, and the inductance for the first inductor 312 known, the capacitance for the second capacitor 315 is fixed. Similarly, with the lower frequency F1, the capacitance for the first capacitor 321, and the inductance for the first inductor 322 known, the inductance for the second inductor 325 is likewise fixed. The resistance for the parasitic resistances 313, 323 in the pass leg should be a minimum value, typically fixed by the losses of the first inductors 312, 322. The second resistors 316, 326 control the rejection impedance, via Q at parallel resonance, but also damp non-resonator modes so the second resistors 316, 326 need to generate a parallel resonance impedance in the range of single digit kΩ. Thus, an initial value for the resistance of the second resistors 316, 326 of 10Ω may be used in the design process.

Figure 5A:
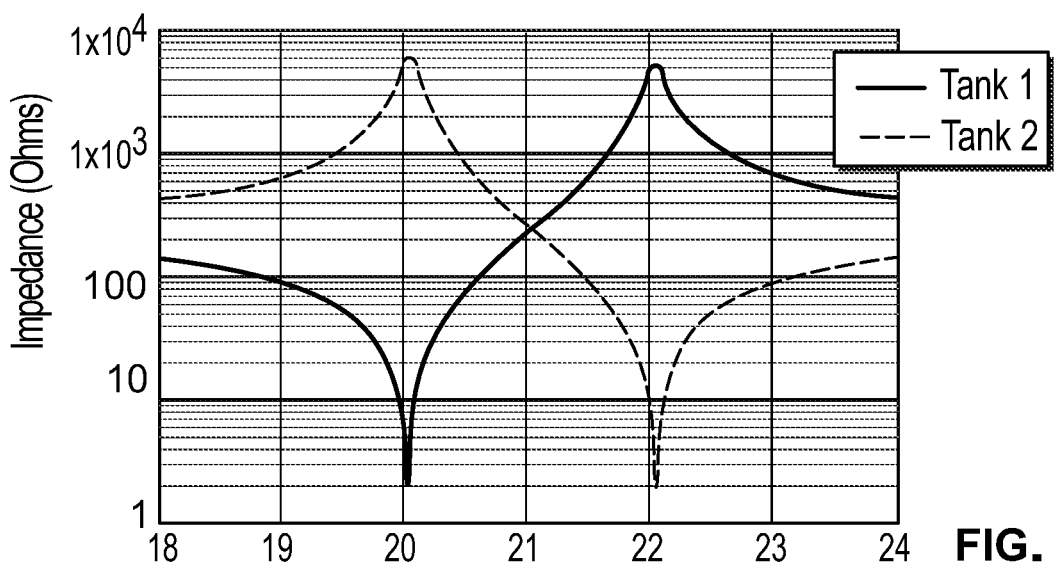
FIGS. 5A and 5B illustrate the simulation results for impedance and phase responses of tank circuits that may be used in one or more embodiments of a parallel-type dual-mode oscillator in accordance with the first class of embodiments of the present invention.
Figure 5B:
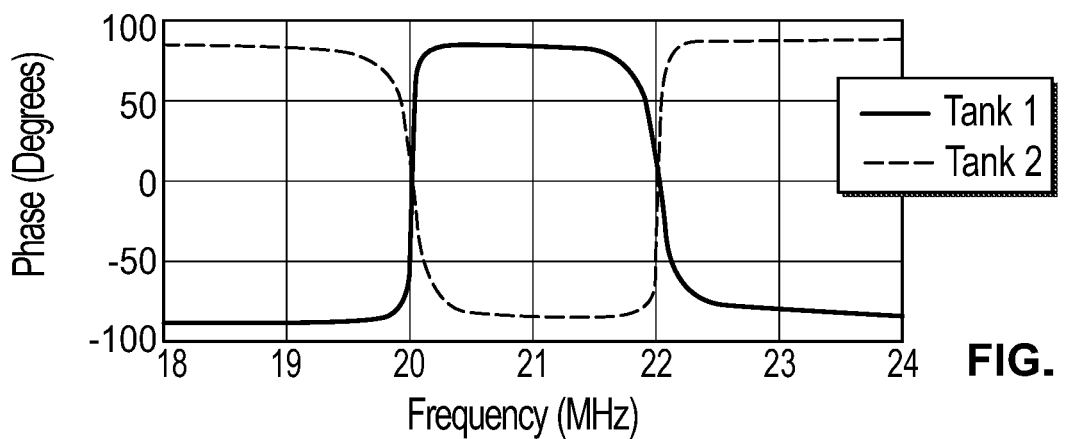

FIGS. 5A and 5B illustrate the simulation results for impedance and phase responses of the first and second tank circuits 210A, 210B, 220A, 220B, respectively. The design lower frequency F1 and upper frequency F2 for the simulation are 20 MHz and 22 MHz, respectively. As illustrated, the difference in the series resonance frequency impedance versus the parallel resonance frequency impedance can readily be more than three orders of magnitude. This difference in series resonance frequency impedance and parallel resonance frequency impedance would provide strong isolation between the two oscillator sub-circuits employing these first and second tank circuits 210A, 210B, 220A, 220B. The nominal values for the various components in the simulation for the first and second tank circuits 210A, 210B, 220A, 220B are given in Table 1.

TABLE 1

Simulation component values.

| First Tank Circuit 210A, 210B | | Second Tank Circuit 220A, 220B | |
|---|---|---|---|
| First Capacitor 311 | 6.33 pF | First Capacitor 321 | 5.22 pF |
| First Inductor 312 | 10 µH | First Inductor 322 | 10 µH |
| Parasitic Resistance 313 | 2 Ω | Parasitic Resistance 323 | 2 Ω |
| Second Capacitor 315 | 30 pF | Second Inductor 325 | 2.1 µH |
| Second Resistor 316 | 10 Ω | Second Resistor 326 | 10 Ω |

Figure 6A:
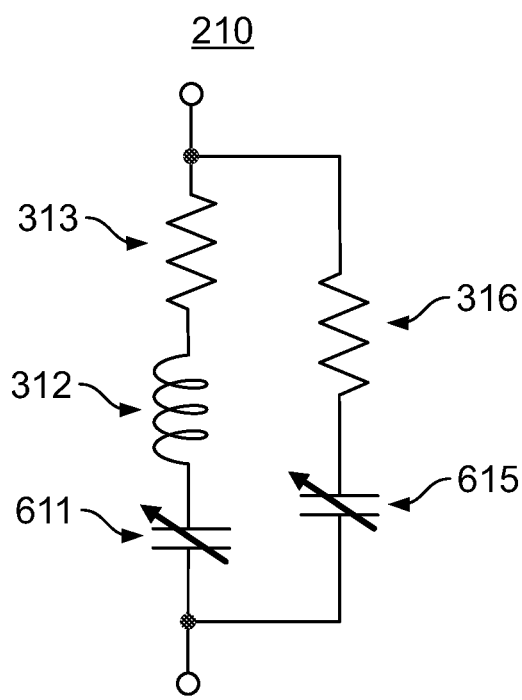
FIGS. 6A and 6B illustrate tank circuits that may be used in one or more embodiments of a parallel-type dual-mode oscillator in accordance with the first class of embodiments of the present invention.
Figure 6B:
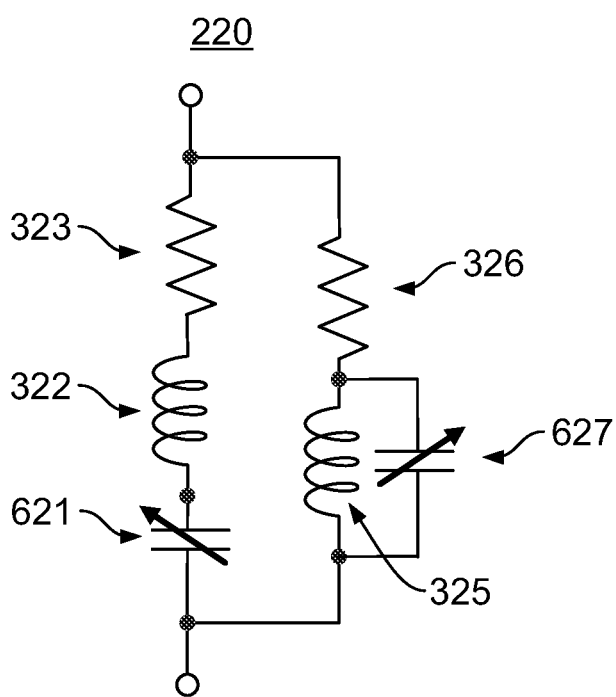

To accurately tune the series and parallel resonance frequencies of the first and second tank circuits 210A, 210B, 220A, 220B, one may need to use trimmable capacitors, for example, laser trimmable capacitors, for the first capacitors 611, 621, and the second capacitor 615, as illustrated in FIGS. 6A and 6B. Accurate tuning of the series and parallel resonance frequencies typically requires better than 1% capacitance values, especially when the lower frequency F1 and the upper frequency F2 are closely spaced. When using trimmable capacitors, it is preferable to tune the series resonance frequencies of the first and second tank circuits 210A, 210B, 220A, 220B first. One then tunes the parallel resonance frequencies of the first and second tank circuits 210A, 210B, 220A, 220B. One may optional include a second trimmable capacitor 627 in the second tank circuits 220A, 220B in parallel with the second inductor 325 to improve tunability of the parallel resonance frequency of the second tank circuits 220A, 220B. Other parasitic capacitances on the circuit boards are generally inconsequential to the frequency tuning process. The first and second tank circuits 210A, 210B, 220A, 220B are preferably tuned through trimming as individual subassemblies.

Figure 7:
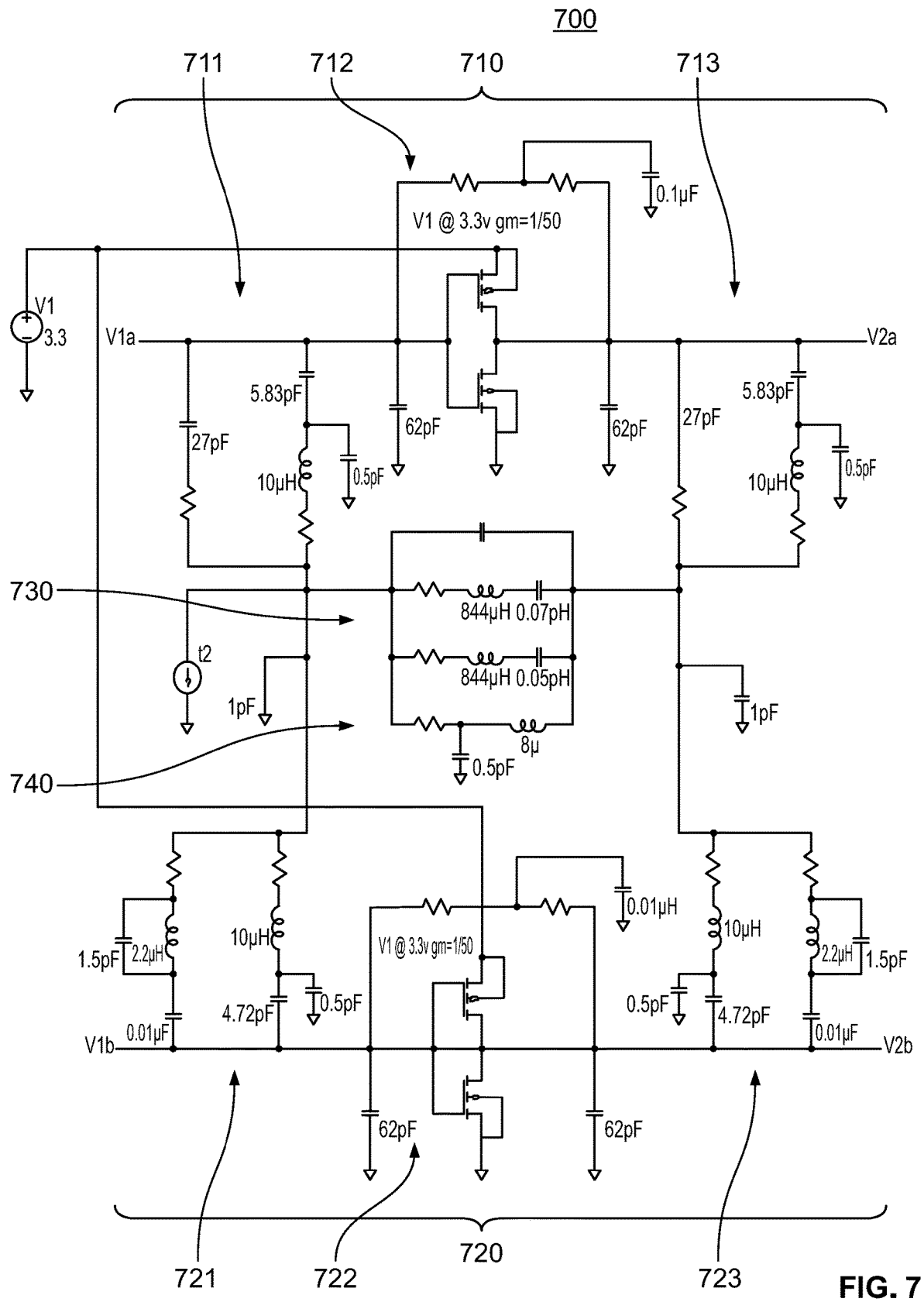
FIG. 7 illustrates a circuit schematic used for modeling a parallel-type dual-mode oscillator in accordance with the first class of embodiments of the present invention.

FIG. 7 illustrates a circuit schematic used for modeling a parallel-type dual-mode oscillator 700 employing first and second oscillator sub-circuits 710, 720 sharing a common SC cut resonator 730. The parallel-type dual-mode oscillator 700 corresponds to one specific physical implementation of the parallel-type dual-mode oscillator 200 illustrated in FIG. 2. This parallel-type dual-mode oscillator 700 is designed to operate at 20 MHz for the first oscillator sub-circuit 710 and 22 MHz for the second oscillator sub-circuit 720. The first oscillator sub-circuit 710 includes an input first tank circuit 711 at the input to a first inverter circuit 712, with an output first tank circuit 713 at the output of the first inverter circuit 712. Similarly, the second oscillator sub-circuit 720 includes an input second tank circuit 721 at the input to a second inverter circuit 722, with an output second tank circuit 723 at the output of the second inverter circuit 722. A third tank circuit 740 is parallel to the SC cut resonator 730. The input first tank circuit 711 and the output first tank circuit 713 correspond to the first tank circuit 210 with the parasitic capacitance 414 illustrated in FIG. 4A. The input second tank circuit 721 and the output second tank circuit 723 correspond to the second tank circuit 220 with the parasitic capacitance 424 illustrated in FIG. 4B. The third tank circuit 740 corresponds to the third tank circuit 230 illustrated in FIG. 3C. FIGS. 8A and 8B illustrate the voltages and currents at various points in the parallel-type dual-mode oscillator 700 based upon a simulation of the parallel-type dual-mode oscillator 700 at steady state (FIG. 8A) and the start-up envelopes (FIG. 8B).

Serial-Type Dual-Mode Oscillator

A second class of embodiments of the present invention employs a serial-type dual-mode oscillator. This second class of embodiments employs commonly used follower circuits that may be formed in bipolar, CMOS, and compound CMOS configurations for the core of the two oscillator sub-circuits. The second class of embodiments, like the first class of embodiments, uses dual-resonance tank circuits to isolate the two oscillator sub-circuits from the SC cut resonator. The following describes three embodiments of this second class, based upon the type of follower circuit employed.

The first class of embodiments, i.e., the parallel-type dual-mode oscillators, operate the SC cut resonator 280 in its inductive region with an impedance $+jX_e$ determined by the pillar capacitors 260A, 270A for the first oscillator sub-circuit and the pillar capacitors 260B, 270B for the second oscillator sub-circuit. In contrast, the second class of embodiments, i.e., the serial-type dual-mode oscillators, operate at the series resonance frequency $F_S$ of the SC cut resonator, where the resonator impedance is approximately a minimum impedance approximately equal to $R_m$.

Due to the low impedance of the SC cut resonator in the serial-type dual-mode oscillator, the second class of embodiments allow for better isolation between the resonator oscillation modes. This means the dominant parasitic oscillations in the serial-type dual-mode oscillator designs are easier to understand and eliminate than the parasitic oscillations in the parallel-type dual-mode oscillator designs. This also means separating the operation of the two series resonant oscillator sub-circuits with L-C tank circuits is more straight forward to execute than separating the operation in the parallel-type dual-mode oscillators of the first class of embodiments.

The low impedance of the SC cut resonator in the serial-type dual-mode oscillator produces at least two design hurdles. First, the serial-type core oscillator sub-circuit is more complicated to design than that of the first class of embodiments. Second, a strong dominant parasitic oscillation exists between the two desired modes due to the series-parallel tank circuits between the resonator and the oscillator sub-circuits forming undesired L-C oscillations. This parasitic oscillation, corresponding to F3, is discussed below with reference to FIG. 17. These undesired oscillations are removed using a second pair of tank circuits that allow the oscillator sub-circuits to have gain at the desired frequencies and no (or limited) gain at the undesired frequencies.

Figure 9:
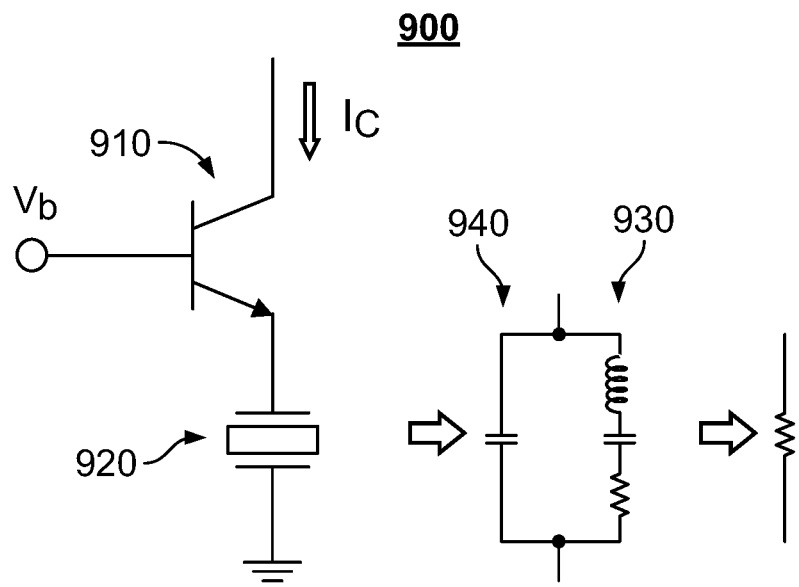
FIG. 9 illustrates a circuit schematic for a voltage follower implemented with bipolar technology that may be used in one or more embodiments of a serial-type dual-mode oscillator in accordance with a second class of embodiments of the present invention.

FIG. 9 illustrates a circuit schematic for a voltage follower 900 implemented with bipolar technology. The voltage follower 900 includes an NPN bipolar transistor 910. A collector current $I_c$ flows into the collector of the NPN bipolar transistor 910. A bias voltage $V_b$ is applied to the base of the NPN bipolar transistor 910. The output impedance of the NPN bipolar transistor 910 $R_{out}=h=1/g_m$, with $g_m$ being the transconductance of the NPN bipolar transistor 910. The emitter of the NPN bipolar transistor 910 is connected to an SC cut resonator 920. The SC cut resonator 920 can be modeled in accordance with the model illustrated in FIG. 1, with a motional leg 930 based on the piezoelectric model in parallel with the static capacitance leg 940. Because the voltage follower 900 is operating at the series resonance frequency $F_S$ of the SC cut resonator 920, the model for the SC cut resonator 920 can be further simplified as a resistor having a resistance $R_m$. The collector current $I_c$ corresponds to the bias voltage $V_b$ divided by the sum of the output impedance and the impedance of the SC cut resonator 920. At the series resonance frequency $F_S$, the collector current $I_c$ simplifies to $I_c=V_b/(h+R_m)$.

The voltage follower 900 transfers the impedance phase of the SC cut resonator 920 to the collector of the NPN bipolar transistor 910. The collector current Q is thus the phase of the collector current $I_c$ relative to the bias voltage $V_b$. The loaded Q ($Q_L$) is less than the Q of the SC cut resonator 920 due to $R_{out}$, where $Q_L$ is the oscillator operating Q defined as a fraction of the Q of the SC cut resonator 920. The $Q_L$ of the collector current $I_c$ depends primarily on the value of $R_{out}$, with $Q_L=R_m/(R_m+h)$. Thus, a high $Q_L$ is achieved when $R_{out}$ is on the order of or less than $R_m$.

Figure 10:
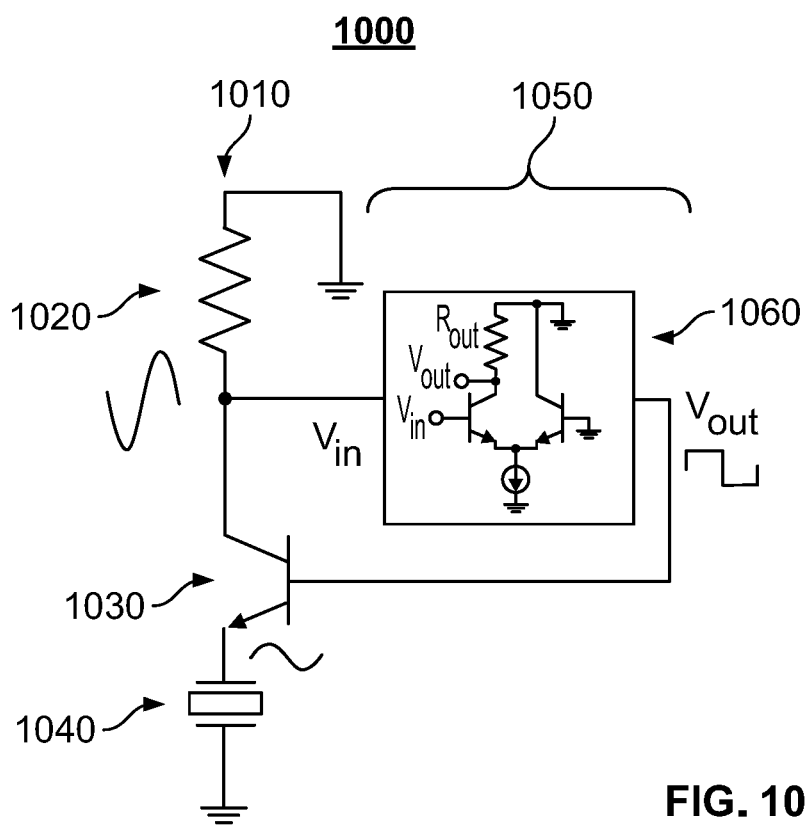
FIG. 10 illustrates a circuit schematic for a two-stage oscillator implemented with bipolar technology that may be used in one or more embodiments of a serial-type dual-mode oscillator in accordance with the second class of embodiments of the present invention.

FIG. 10 illustrates a circuit schematic for a two-stage oscillator 1000 implemented with bipolar technology employing the voltage follower 900 as part of the first stage 1010. The first stage 1010 includes a resistor 1020, an NPN bipolar transistor 1030 having a transconductance of $g_m$ and an $h=1/g_m$, and an SC cut resonator 1040. The two-stage oscillator 1000 operates at the series resonance $F_S$ of the SC cut resonator 1040. The NPN bipolar transistor 1030 operates as an emitter follower in linear mode. The first stage 1010 plays little to no role in amplitude limiting of the overall two-stage oscillator 1000.

The second stage 1050 of the two-stage oscillator 1000 includes an inverting amplifier/limiter circuit 1060, with an example inverting amplifier/limiter circuit 1060 topology illustrated in the inset box of FIG. 10. The second stage 1050 provides current-voltage gain via the resistor 1020. The magnitude of the gain of the inverting amplifier/limiter circuit 1060 is $A_V$. The limiter function of the inverting amplifier/limiter circuit 1060 provides a fixed, low amplitude (hundreds of millivolts) output over the desired range of $R_m$ for the SC cut resonator 1040. The loop gain of the two-stage oscillator 1000, denoted $A_L$, is given by $A_L=R_1A_V/(Z_{Y1}+h)$. At the series resonance $F_S$ of the SC cut resonator 1040, the loop gain simplifies to $A_L=R_1A_V/(R_m+h)$.

Figure 11A:
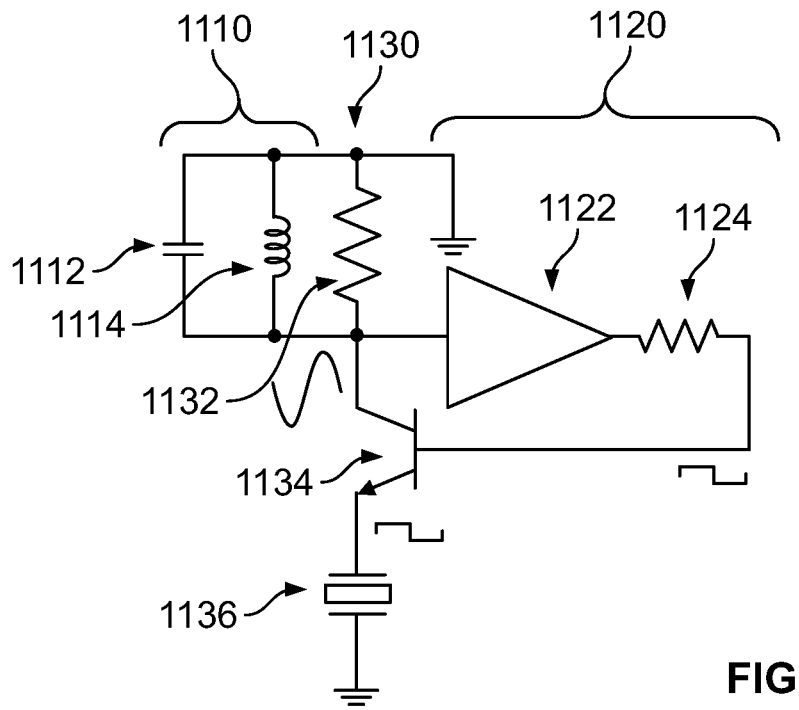
FIGS. 11A and 11B illustrate circuit schematics for a two-stage oscillator implemented with bipolar technology employing a tank circuit at the input and the output of a second stage, respectively, that may be used in one or more embodiments of a serial-type dual-mode oscillator in accordance with the second class of embodiments of the present invention.
Figure 11B:
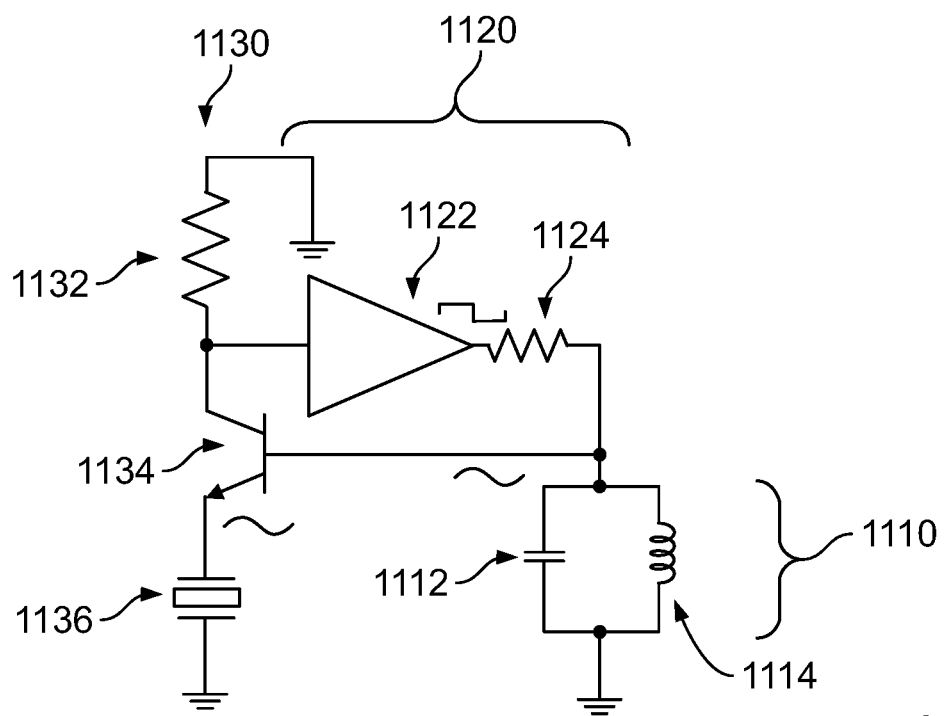

FIGS. 11A and 11B illustrate circuit schematics for a two-stage oscillator 1100 implemented with bipolar technology employing a tank circuit 1110 at the input and the output of a second stage 1120, respectively. The first stage 1130 includes a resistor 1132, an NPN bipolar transistor 1134 having a transconductance of $g_m$ and an $h=1/g_m$, and an SC cut resonator 1136. The two-stage oscillator 1100 operates at the series resonance $F_S$ of the SC cut resonator 1136. The NPN bipolar transistor 1134 operates as an emitter follower in linear mode. The first stage 1130 plays little to no role in amplitude limiting of the overall two-stage oscillator 1100.

The second stage 1120 of the two-stage oscillator 1100 includes an inverting amplifier/limiter circuit 1122 and a resistor 1124. The second stage 1120 provides current-voltage gain via the resistor 1132. The magnitude of the gain of the inverting amplifier/limiter circuit 1122 is $A_V$. The limiter function of the inverting amplifier/limiter circuit 1122 provides a fixed, low amplitude (hundreds of millivolts) output over the desired range of $R_m$ for the SC cut resonator 1136. The loop gain of the two-stage oscillator 1100, denoted $A_L$, is given by $A_L=R_1A_V/(Z_{Y1}+h)$. At the series resonance $F_S$ of the SC cut resonator 1136, the loop gain simplifies to $A_L=R_1A_V/(R_m+h)$.

To ensure operation at the series resonance $F_S$ of the SC cut resonator 1136, a tank circuit 1110 may be placed in parallel with the resistor 1132 at the input to the second stage 1120 as illustrated in FIG. 11A. Alternatively, to ensure operation at the series resonance $F_S$ of the SC cut resonator 1136, a tank circuit 1110 may be placed between the output to the second stage 1120 and ground as illustrated in FIG. 11B. In each case, the tank circuit 1110 includes a capacitor 1112 in parallel with an inductor 1114. The tank circuit 1110 is preferably placed at the input or output of the second stage 1120 having the highest impedance.

Figure 12:
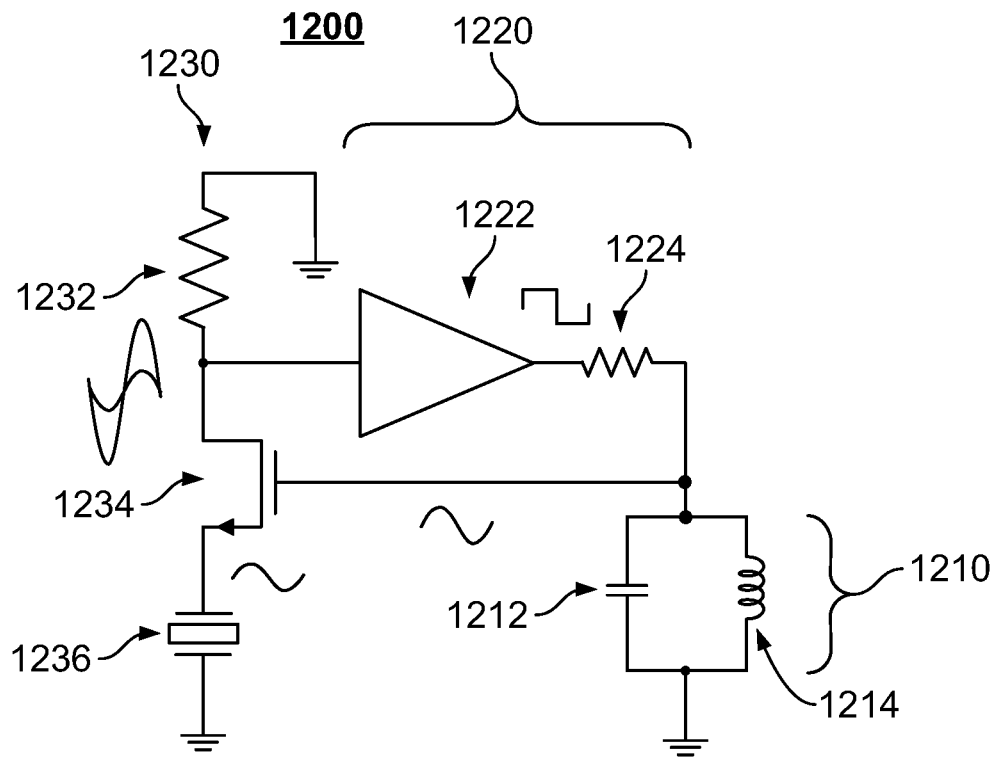
FIG. 12 illustrates a circuit schematic for a two-stage oscillator implemented using a source follower in CMOS technology that may be used in one or more embodiments of a serial-type dual-mode oscillator in accordance with the second class of embodiments of the present invention.

FIG. 12 illustrates a circuit schematic for a two-stage oscillator 1200 implemented using a source follower in CMOS technology employing a tank circuit 1210 at the output of a second stage 1220. The first stage 1230 includes a resistor 1232, a p-type metal oxide semiconductor field effect transistor (MOSFET) 1234 having a transconductance of $g_m$ and an $h=1/g_m$, and an SC cut resonator 1236. The two-stage oscillator 1200 operates at the series resonance $F_S$ of the SC cut resonator 1236. The p-type MOSFET 1234 operates as a source follower in linear mode. The first stage 1230 plays little to no role in amplitude limiting of the overall two-stage oscillator 1200.

The second stage 1220 of the two-stage oscillator 1200 includes an inverting amplifier/limiter circuit 1222 and a resistor 1224. The second stage 1220 provides current-voltage gain via the resistor 1232. The magnitude of the gain of the inverting amplifier/limiter circuit 1222 is $A_V$. The limiter function of the inverting amplifier/limiter circuit 1222 provides a fixed, low amplitude (hundreds of millivolts) output over the desired range of $R_m$ for the SC cut resonator 1236. The loop gain of the two-stage oscillator 1200, denoted $A_L$, is given by $A_L=R_1A_V/(Z_{Y1}+h)$. At the series resonance $F_S$ of the SC cut resonator 1236, the loop gain simplifies to $A_L=R_1A_V/(R_m+h)$.

To ensure operation at the series resonance $F_S$ of the SC cut resonator 1236, a tank circuit 1210 may be placed between the output to the second stage 1220 and ground as illustrated in FIG. 12. The tank circuit 1210 includes a capacitor 1212 in parallel with an inductor 1214.

Figure 13:
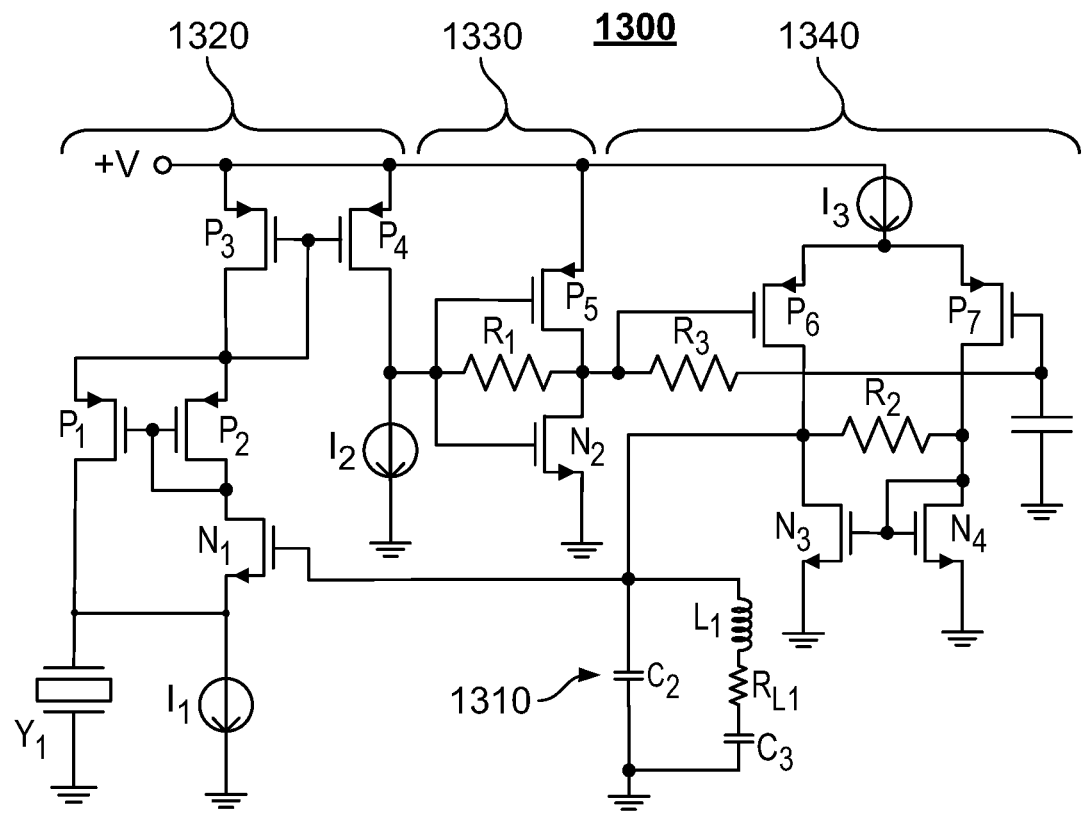
FIG. 13 illustrates a circuit schematic for a three-stage oscillator implemented using a compound-source follower in CMOS technology that may be used in one or more embodiments of a serial-type dual-mode oscillator in accordance with the second class of embodiments of the present invention.

FIG. 13 illustrates a circuit schematic for a three-stage oscillator 1300 implemented using a compound-source follower in CMOS technology employing a tank circuit 1310. The first stage 1320 forms a compound-source follower including four p-type MOSFETs $P_1$, $P_2$, $P_3$, $P_4$, an n-type MOSFET $N_1$, two current sources $I_1$, $I_2$, and an SC cut resonator $Y_1$. The three-stage oscillator 1300 operates at the series resonance $F_S$ of the SC cut resonator $Y_1$.

The second stage 1330 of the three-stage oscillator 1300 includes a transimpedance amplifier (TIA) for converting the current output signal received from the first stage 1320 into a voltage signal. The second stage 1330 includes a p-type MOSFET $P_5$, an n-type MOSFET $N_2$, and a resistor $R_1$.

The third stage 1340 of the three-stage oscillator 1300 includes an inverting amplifier/limiter circuit. The inverting amplifier/limiter circuit includes a pair of p-type MOSFETs $P_6$, $P_7$, a pair n-type MOSFETs $N_3$, $N_4$, a pair of resistors $R_2$, $R_3$, and a capacitor $C_1$.

To ensure operation at the series resonance $F_S$ of the SC cut resonator $Y_1$, a tank circuit 1310 may be placed between a node common to the output to the third stage 1340 and the input to the first stage 1320 and ground as illustrated in FIG. 13. The tank circuit 1310 includes a capacitor $C_2$ in parallel with the series combination of an inductor $L_1$, a resistor $R_{L1}$, and a capacitor $C_3$.

The bipolar transistor implemented follower circuit employed in the embodiment illustrated in FIG. 11, the MOSFET implemented follower circuit employed in the embodiment illustrated in FIG. 12, and the compound-transistor follower employed in the embodiment illustrated in FIG. 13 have various general properties. The bipolar transistor and the MOSFET implemented follower circuits both have an output resistance equal to the inverse of the transconductance of their corresponding transistors, i.e., $R_{out}=1/g_m$. For the transconductance $g_m$ of the bipolar transistor that may typically be used in the bipolar transistor implemented follower circuit, the output resistance $R_{out}$ will be on the order of 26Ω per mA of current. The output resistance $R_{out}$ of the MOSFET implemented follower circuit, as well as its current and size, will be process dependent. The output resistance $R_{out}$ for a typical process will be approximately a factor of 5 to 10 times larger than that for the bipolar transistor implemented follower circuit.

Figure 14:
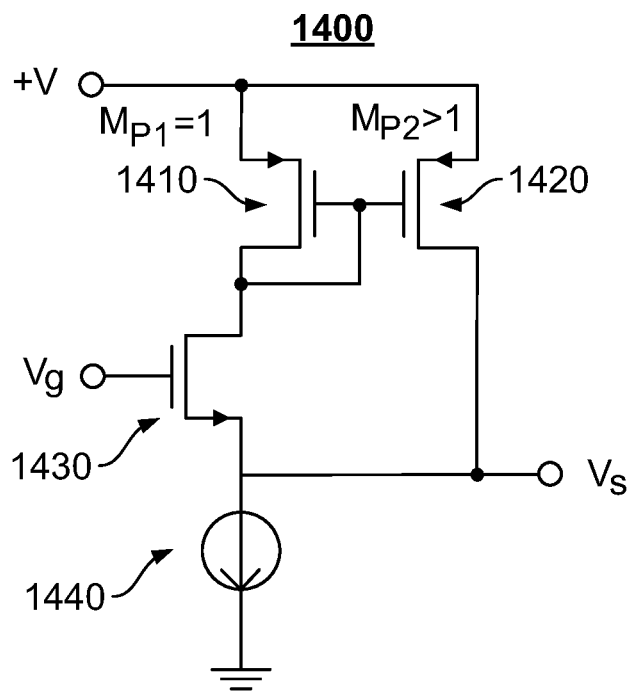
FIG. 14 illustrates a compound-transistor follower circuit that may be used in one or more embodiments of a serial-type dual-mode oscillator in accordance with the second class of embodiments of the present invention.

FIG. 14 illustrates a compound-transistor follower circuit 1400 in isolation. The compound-transistor follower circuit 1400 includes a pair of p-type MOSFETs 1410, 1420 (with the current passed by p-type MOSFET 1420 being greater than the current passed by p-type MOSFET 1410), an n-type MOSFET 1430, and a current source 1440. The output impedance $R_{out}$ for the compound-transistor follower circuit 1400 is $R_{out}=1/[g_{m1}(M_{P2}/M_{P1}+1)]$. The output resistance $R_{out}$ of the compound-transistor follower circuit 1400, as well as its current and size, will be design and process dependent. The output resistance $R_{out}$ for a typical design and process will be approximately a factor of one-half to one-third of that for the MOSFET implemented follower circuit, such as that described above with reference to FIG. 12.

Figure 15:
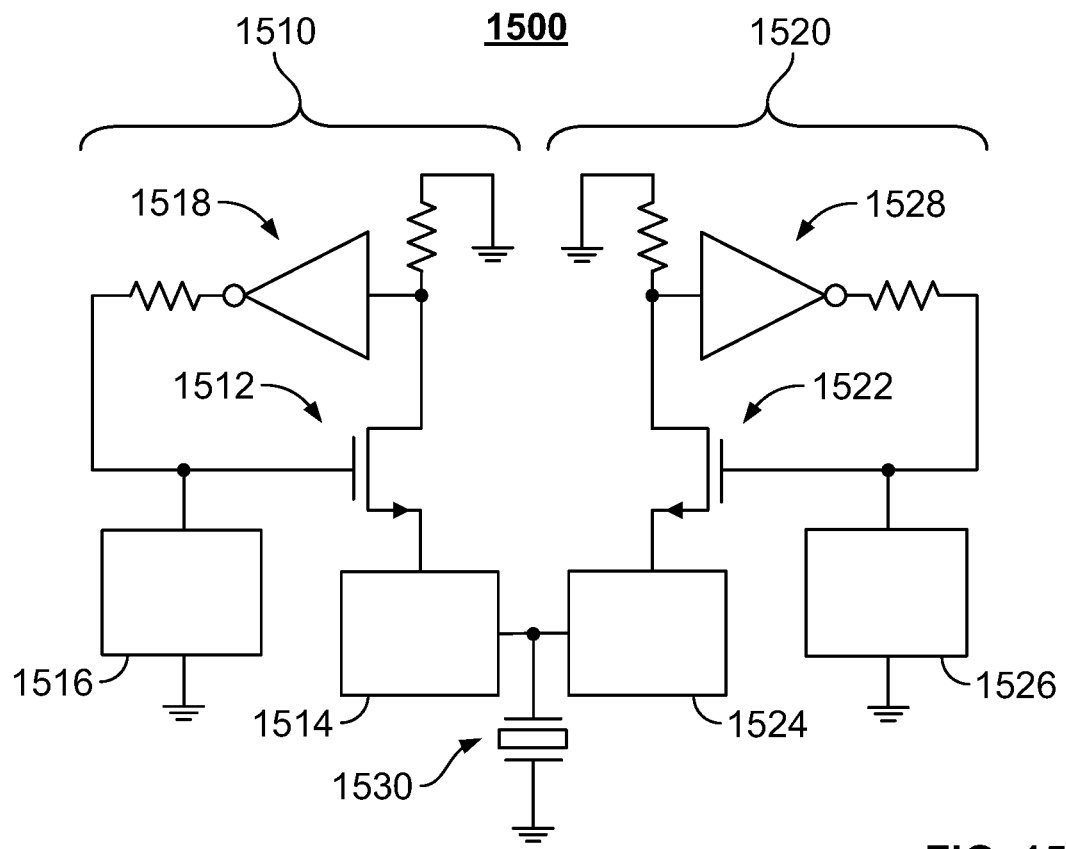
FIG. 15 illustrates a block diagram of a serial-type dual-mode oscillator in accordance with the second class of embodiments of the present invention.

FIG. 15 illustrates a block diagram of a serial-type dual-mode oscillator 1500 employing two MOSFET implemented follower circuits to form two corresponding oscillator sub-circuits 1510, 1520 sharing a common SC cut resonator 1530. The first oscillator sub-circuit 1510 includes a MOSFET implemented follower circuit with an n-type MOSFET 1512, a first tank circuit 1514 between the n-type MOSFET 1512 and the SC cut resonator 1530, a third tank circuit 1516 connected between the gate of the n-type MOSFET 1512 and ground, and an inverting amplifier/limiter circuit 1518 having a gain magnitude of $A_{V1}$. The second oscillator sub-circuit 1520 includes a MOSFET implemented follower circuit with an n-type MOSFET 1522, a second tank circuit 1524 between the n-type MOSFET 1522 and the SC cut resonator 1530, a fourth tank circuit 1526 connected between the gate of the n-type MOSFET 1522 and ground, and an inverting amplifier/limiter circuit 1528 having a gain magnitude of $A_{V2}$.

The SC cut resonator 1530, like those in previous embodiments, has modes at both a lower frequency F1 and an upper frequency F2. With the serial-type dual-mode oscillator 1500 one also needs to define a parasitic frequency F3 corresponding to the average of the lower frequency F1 and the upper frequency F2, i.e., F3=(F1+F2)/2. The source of this parasitic frequency F3 will be described below with reference to FIG. 17.

FIGS. 16A-16D illustrate the first through fourth tank circuits 1514, 1524, 1516, 1526, respectively, which enable dual-mode isolation. The first and second tank circuits 1514, 1524 implement a pass or block function between the first and second oscillator sub-circuits 1510, 1520 and the SC cut resonator 1530. The first tank circuit 1514, illustrated in FIG. 16A, includes a first capacitor 1610, a first inductor 1612, and a parasitic resistance 1614 in a first leg in parallel with a second leg that includes a second capacitor 1616 and a second resistor 1618. The first tank circuit 1514 has a low impedance at F1 by tuning the first capacitor 1610 and the first inductor 1612 to resonate at F1, thereby passing the lower frequency F1. The first tank circuit 1514 has a high impedance at F2 by tuning the series combination of the first capacitor 1610 and the first inductor 1612 in parallel with the second capacitor 1616 to resonate at F2, thereby blocking the upper frequency F2.

Figure 16A:
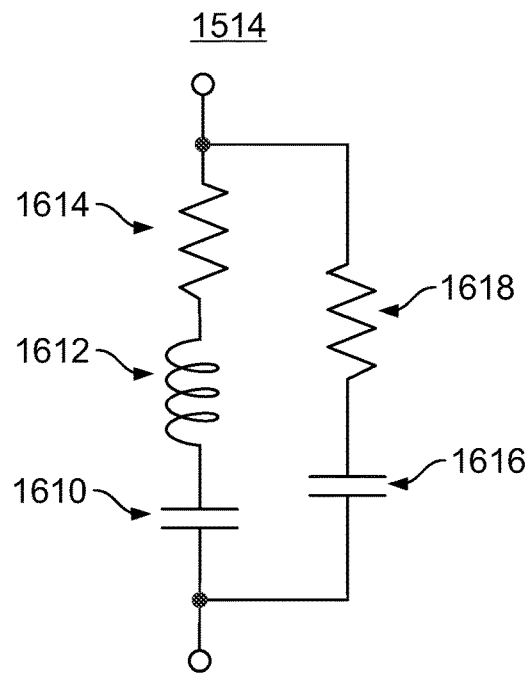
FIGS. 16A-16D illustrate four tank circuits that may be used in one or more embodiments of a serial-type dual-mode oscillator in accordance with the second class of embodiments of the present invention.
Figure 16B:
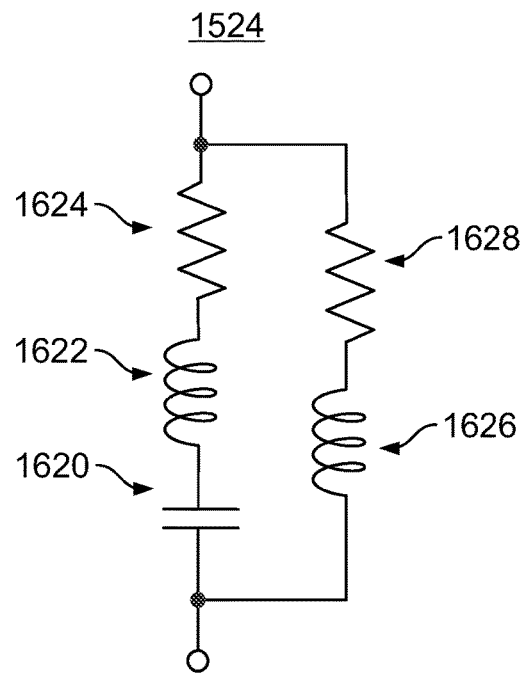
Figure 16C:
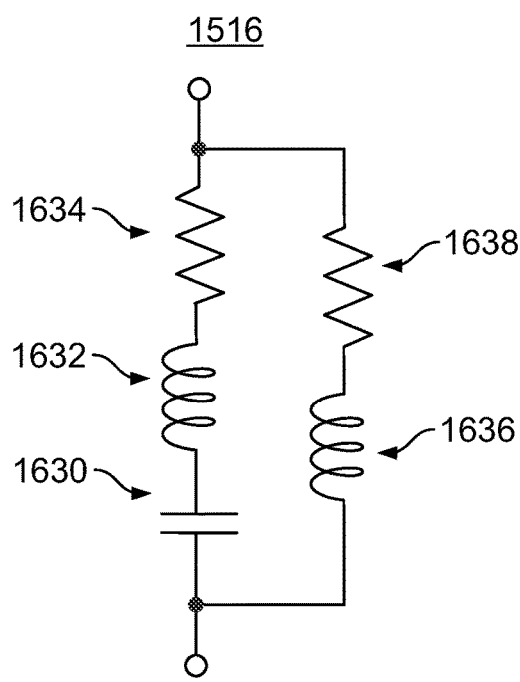

The second tank circuit 1524, illustrated in FIG. 16B, includes a first capacitor 1620, a first inductor 1622, and a parasitic resistance 1624 in a first leg in parallel with a second leg that includes a second inductor 1626 and a second resistor 1628. The second tank circuit 1524 has a low impedance at F2 by tuning the first capacitor 1620 and the first inductor 1622 to resonate at F2, thereby passing the upper frequency F2. The second tank circuit 1524 has a high impedance at F1 by tuning the series combination of the first capacitor 1620 and the first inductor 1622 in parallel with the second inductor 1626 to resonate at F1, thereby blocking the lower frequency F1.

The third and fourth tank circuits 1516, 1526 allow amplifier/limiter gain at the desired frequencies F1 and F2, and very low or no gain at the parasitic frequency F3. The third tank circuit 1516, illustrated in FIG. 16C, includes a first capacitor 1630, a first inductor 1632, and a parasitic resistance 1634 in a first leg in parallel with a second leg that includes a second inductor 1636 and a second resistor 1638.

The third tank circuit 1516 has a low impedance at the parasitic frequency F3, significantly reducing the amplifier/limiter gain at F3. This is accomplished by tuning the first capacitor 1630 and the first inductor 1632 to resonate at the parasitic frequency F3, thereby shunting F3 to ground. The third tank circuit 1516 has a high impedance at F1, thereby permitting amplifier/limiter gain at F1. This is accomplished by tuning the series combination of the first capacitor 1630 and the first inductor 1632 in parallel with the second inductor 1636 to resonate at F1, thereby blocking the lower frequency F1, i.e., not shunting F1 to ground.

Figure 16D:
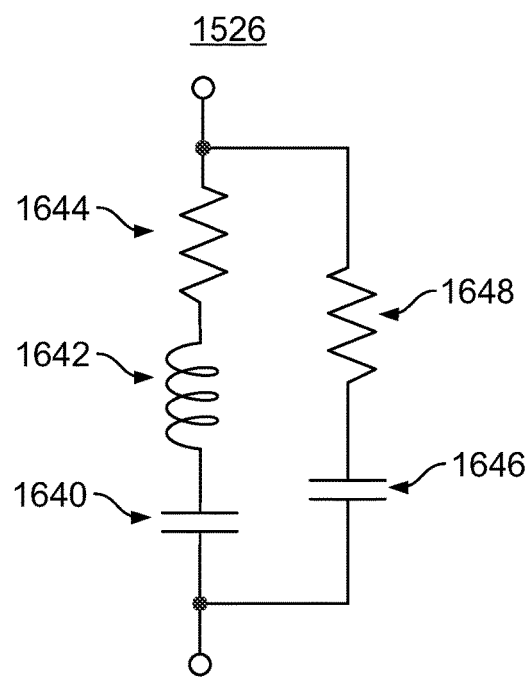

The fourth tank circuit 1526, illustrated in FIG. 16D, includes a first capacitor 1640, a first inductor 1642, and a parasitic resistance 1644 in a first leg in parallel with a second leg that includes a second capacitor 1646 and a second resistor 1648. The fourth tank circuit 1526 has a low impedance at the parasitic frequency F3, significantly reducing the amplifier/limiter gain at F3. This is accomplished by tuning the first capacitor 1640 and the first inductor 1642 to resonate at the parasitic frequency F3, thereby shunting F3 to ground. The fourth tank circuit 1526 has a high impedance at F2, thereby permitting amplifier/limiter gain at F2. This is accomplished by tuning the series combination of the first capacitor 1640 and the first inductor 1642 in parallel with the second capacitor 1646 to resonate at F2, thereby blocking the upper frequency F2, i.e., not shunting F2 to ground.

As with the tank circuits of the first class of embodiments (parallel-type dual-mode oscillators), the tank circuits of the second class of embodiments (serial-type dual-mode oscillators) include parasitic resistances due primarily to losses in the first inductors. As with the tank circuits of the first class of embodiments, the tank circuits of the second class of embodiments also include parasitic capacitances, though these have not been illustrated in FIGS. 16A-16D. These parasitic resistances and parasitic capacitances are included for design and modeling purposes but will not be separate or added components of the physically implemented tank circuits of the second class of embodiments.

As with the tank circuits of the first class of embodiments (parallel-type dual-mode oscillators), the tank circuits of the second class of embodiments (serial-type dual-mode oscillators) may employ trimmable capacitors for more exact tuning of the low impedance (passing) and high impedance (blocking) frequencies.

Figure 17:
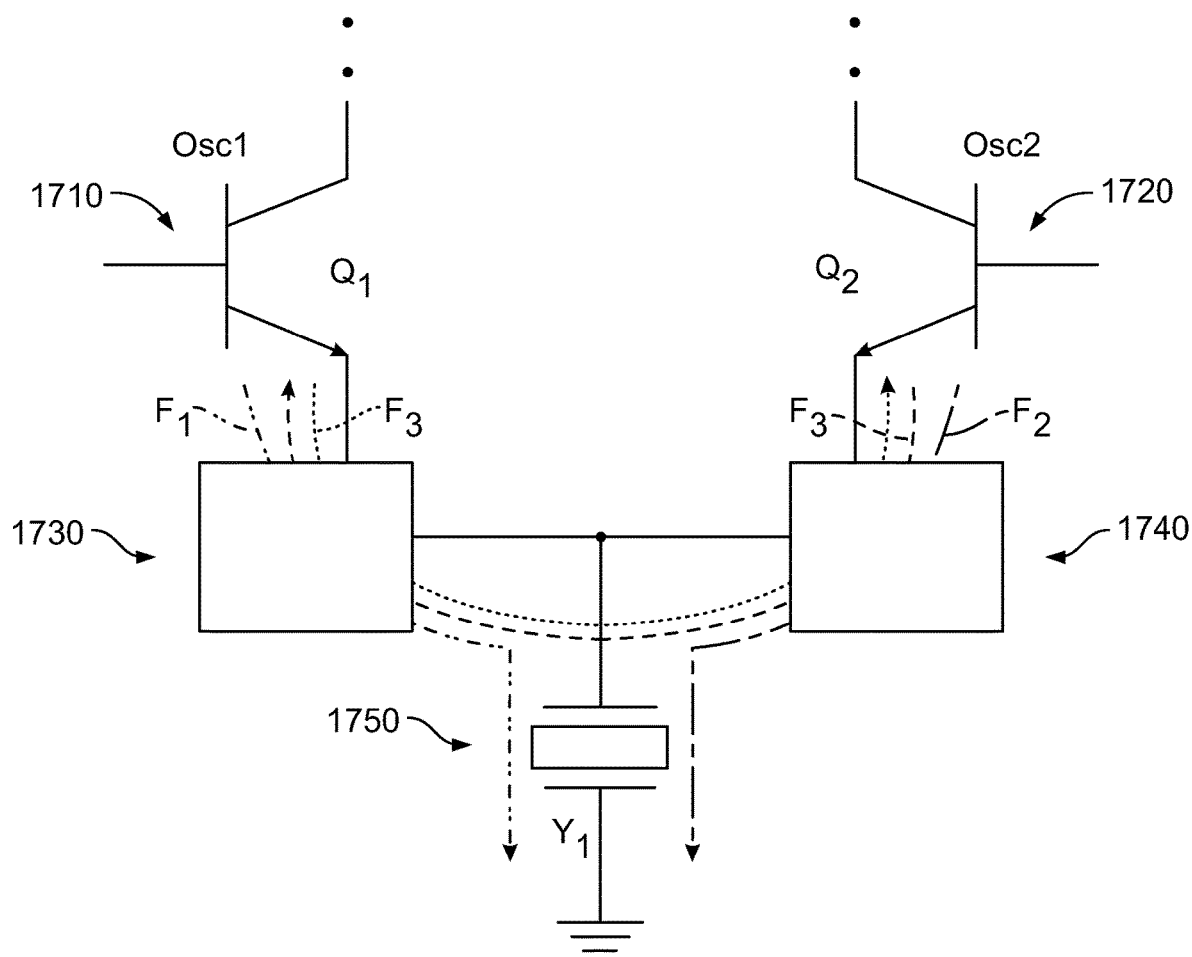
FIG. 17 illustrates a portion of a circuit schematic of a serial-type dual-mode oscillator in accordance with the second class of embodiments of the present invention and the source of a potential parasitic oscillation.

FIG. 17 illustrates a portion of a block diagram of a serial-type dual-mode oscillator 1700 employing oscillator sub-circuits with bipolar transistors 1710, 1720, corresponding first and second tank circuits 1730, 1740, and a shared SC cut resonator 1750. The purpose of FIG. 17 is to assist in understanding the source of the parasitic frequency F3. As with the embodiment illustrated in FIG. 15, the first tank circuit 1730 has a low impedance at F1, thereby passing the lower frequency F1, and a high impedance at F2, thereby blocking the upper frequency F2. Conversely, the second tank circuit 1740 has a low impedance at F2, thereby passing the upper frequency F2, and a high impedance at F1, thereby blocking the lower frequency F1. However, the first and second tank circuits 1730, 1740 form a series resonant circuit at F3, which is approximately halfway between the lower frequency F1 and the upper frequency F2. This low impedance resonance forms a parasitic oscillation at F3=(F1+F2)/2. The serial-type dual-mode oscillator 1500 illustrated in FIG. 15 eliminates this parasitic frequency F3 by shunting it to ground using the third and fourth tank circuits 1516, 1526.

Figure 18A:
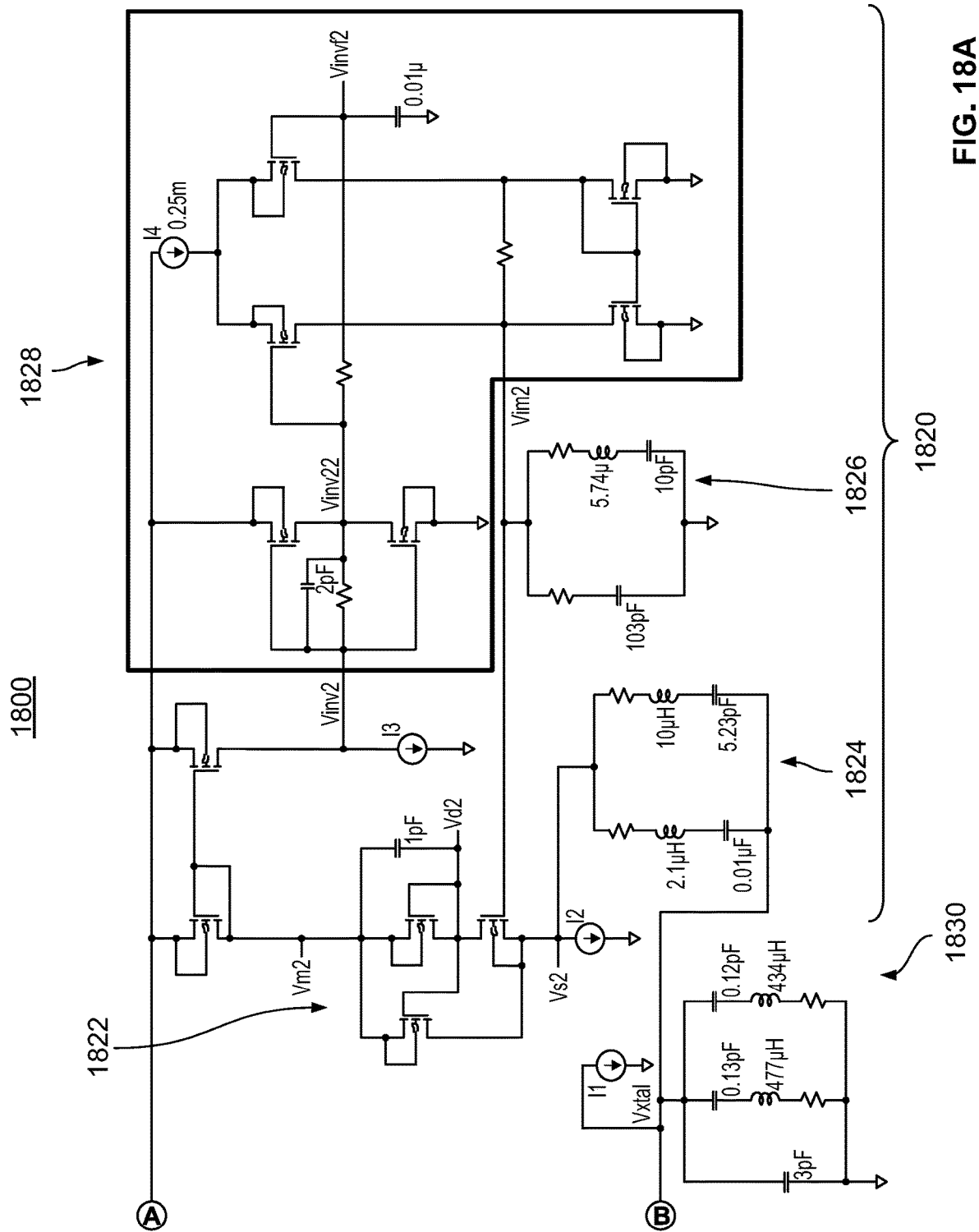
FIGS. 18A-18B illustrate a circuit schematic used for modeling a serial-type dual-mode oscillator in accordance with the second class of embodiments of the present invention.
Figure 18B:
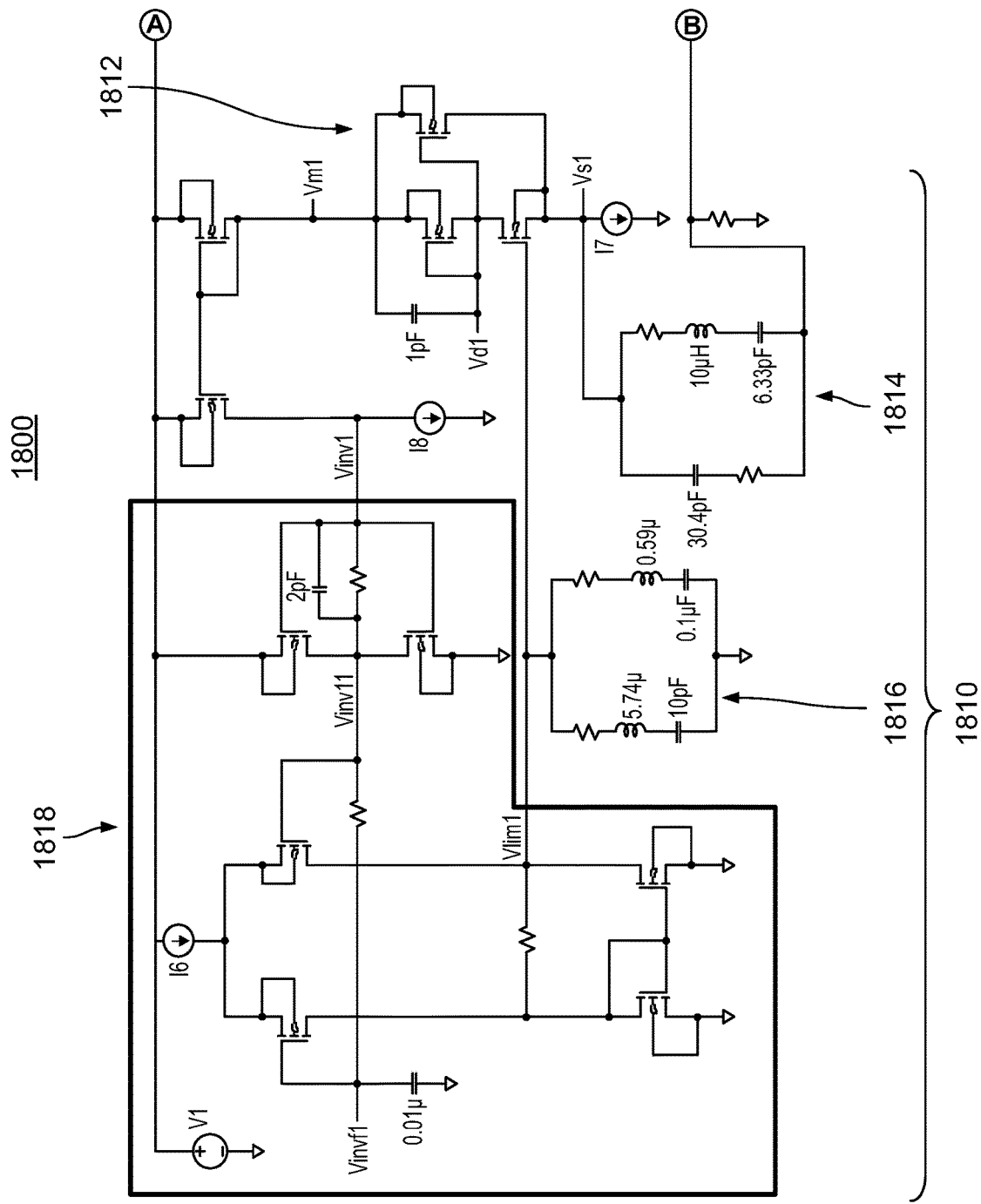

FIGS. 18A-18B illustrate a circuit schematic used for modeling a serial-type dual-mode oscillator 1800 employing two compound-transistor follower circuits to form two corresponding first and second oscillator sub-circuits 1810, 1820 sharing a common SC cut resonator 1830. This serial-type dual-mode oscillator 1800 is designed to operate at 20 MHz for the first oscillator sub-circuit 1810 and 22 MHz for the second oscillator sub-circuit 1820. The first oscillator sub-circuit 1810 includes a first compound-transistor follower circuit 1812, a first tank circuit 1814, a third tank circuit 1816, and a first inverting amplifier/limiter circuit 1818. Similarly, the second oscillator sub-circuit 1820 includes a first compound-transistor follower circuit 1822, a second tank circuit 1824, a fourth tank circuit 1826, and a second inverting amplifier/limiter circuit 1828. The first through fourth tank circuits 1814, 1824, 1816, 1826 correspond to the first through fourth tank circuits 1514, 1524, 1516, 1526 discussed above with reference to FIGS. 15 and 16A-16D.

Figure 19:
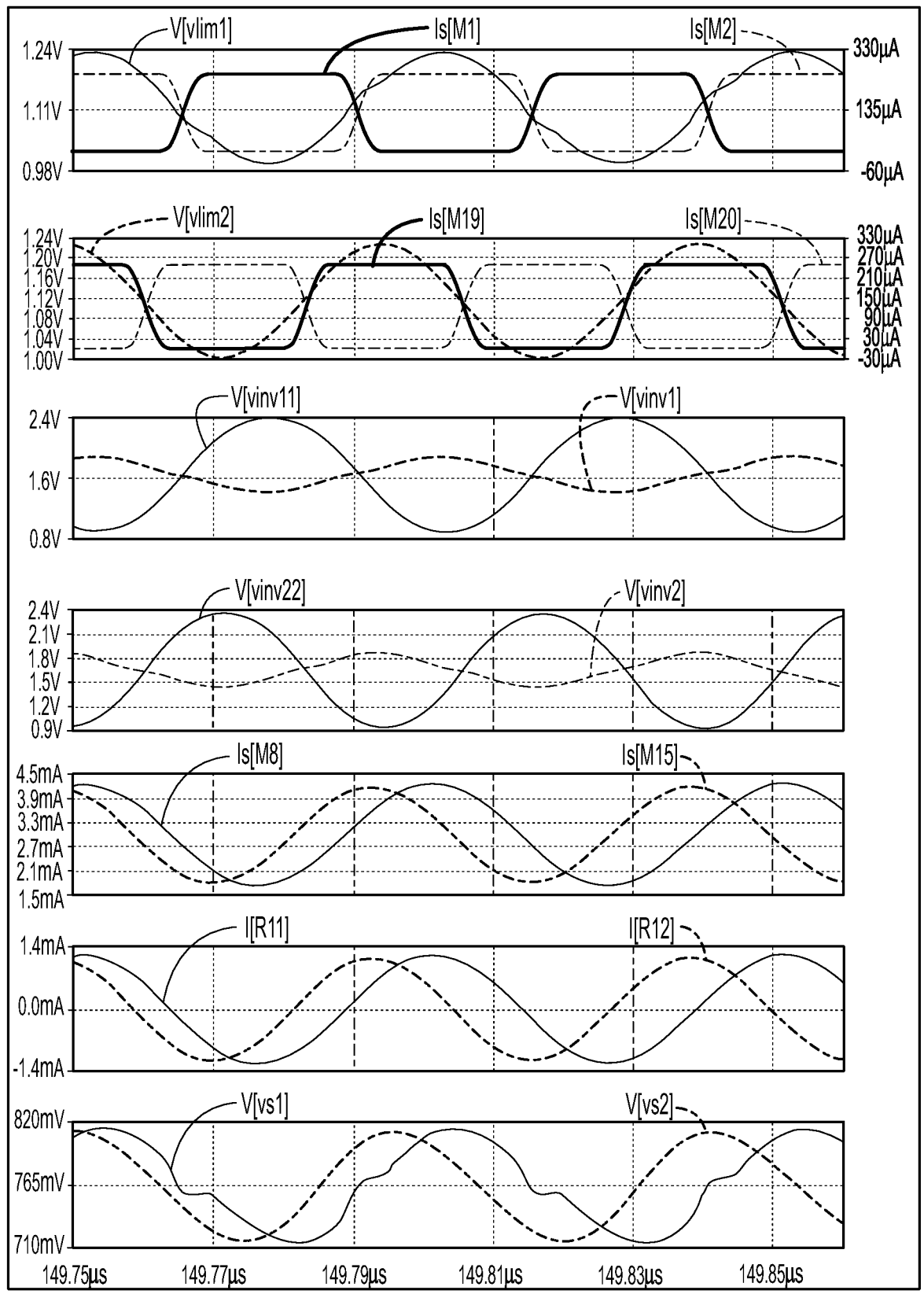
FIG. 19 illustrates the voltages and currents at various points in a serial-type dual-mode oscillator in accordance with the second class of embodiments of the present invention at steady state.

FIG. 19 illustrates the steady state voltages and currents at various points in the serial-type dual-mode oscillator 1800 based upon a simulation of the serial-type dual-mode oscillator 1800. The serial-type dual-mode oscillator 1800 achieves approximately 20 dB of isolation between the first oscillator sub-circuit 1810 and the second oscillator sub-circuit 1820

The serial-type dual-mode oscillator 1800 discussed above with reference to FIG. 18 operated with closely spaced lower frequency F1 and upper frequency F2. In other embodiments of the present invention, a serial-type dual-mode oscillator may operate with widely spaced lower frequency F1 and upper frequency F2. For example, the upper frequency may be an overtone, e.g., 3× or 5×, of the lower frequency F1.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A parallel-type dual-mode oscillator comprising:
   a resonator, the resonator adapted to resonate at a lower frequency F1 and an upper frequency F2;
   a first oscillator sub-circuit adapted to operate at the lower frequency F1, the first oscillator sub-circuit including:
   a first input tank circuit, the first input tank circuit coupled to the resonator, the first input tank circuit adapted to pass the lower frequency F1 and to block the upper frequency F2;
   a first inverter, the first inverter coupled to the first input tank circuit, the first inverter adapted to invert a signal from the first input tank circuit; and
   a first output tank circuit, the first output tank circuit coupled to the first inverter and the resonator, the first output tank circuit adapted to pass the lower frequency F1 and to block the upper frequency F2;
   a second oscillator sub-circuit adapted to operate at the upper frequency F2, the second oscillator sub-circuit including:
   a second input tank circuit, the second input tank circuit coupled to the resonator, the second input tank circuit adapted to pass the upper frequency F2 and to block the lower frequency F1;

a second inverter, the second inverter coupled to the second input tank circuit, the second inverter adapted to invert a signal from the second input tank circuit; and a second output tank circuit, the second output tank circuit coupled to the second inverter and the resonator, the second output tank circuit adapted to pass the upper frequency F2 and to block the lower frequency F1; and a third tank circuit, the third tank circuit coupled to the resonator in parallel, the third tank circuit in parallel with the resonator adapted to have a capacitive impedance at the lower frequency F1 and at the upper frequency F2.

2. The parallel-type dual-mode oscillator of claim 1, wherein the first input tank circuit and the first output tank circuit each includes:
a first leg in parallel with a second leg;
wherein the first leg includes in series:
 a first capacitor; and
 a first inductor; and
wherein the second leg includes in series:
 a second capacitor; and
 a second resistor.

3. The parallel-type dual-mode oscillator of claim 2, wherein a series combination of the first capacitor and the first inductor is adapted to resonate at the lower frequency F1; and
wherein a series combination of the first capacitor and the first inductor in parallel with the second capacitor is adapted to resonate at the upper frequency F2.

4. The parallel-type dual-mode oscillator of claim 1, wherein the second input tank circuit and the second output tank circuit each includes:
a first leg in parallel with a second leg;
wherein the first leg includes in series:
 a first capacitor; and
 a first inductor; and
wherein the second leg includes in series:
 a second inductor; and
 a second resistor.

5. The parallel-type dual-mode oscillator of claim 4, wherein a series combination of the first capacitor and the first inductor is adapted to resonate at the upper frequency F2; and
wherein a series combination of the first capacitor and the first inductor in parallel with the second inductor is adapted to resonate at the lower frequency F1.

6. The parallel-type dual-mode oscillator of claim 4, wherein the second leg further includes a second capacitor in parallel with the second inductor.

7. The parallel-type dual-mode oscillator of claim 1, wherein the third tank circuit includes in series:
 a first inductor; and
 a first resistor.

8. The parallel-type dual-mode oscillator of claim 1, wherein one or more of the first input tank circuit, the first output tank circuit, the second input tank circuit, or the second output tank circuit includes a trimmable capacitor.

9. The parallel-type dual-mode oscillator of claim 1, wherein the upper frequency F2 is within approximately 10% of the lower frequency F1 or the upper frequency F2 is an odd integer multiple of the lower frequency F1.

10. A serial-type dual-mode oscillator comprising:
a resonator, the resonator adapted to resonate at a lower frequency F1 and an upper frequency F2, a parasitic frequency F3 corresponding approximately to an average of the lower frequency F1 and the upper frequency F2;

a first oscillator sub-circuit adapted to operate at the lower frequency F1, the first oscillator sub-circuit including:
 a first tank circuit, the first tank circuit coupled to the resonator, the first tank circuit adapted to pass the lower frequency F1 and to block the upper frequency F2;
 a first follower circuit, the first follower circuit including a first node coupled to the first tank circuit, a second node, and a third node;
 a third tank circuit, the third tank circuit coupled between the second node of the first follower circuit and ground, the third tank circuit adapted to allow amplifier/limiter gain at the lower frequency F1 and to shunt the parasitic frequency F3 to ground; and
 a first inverting amplifier/limiter circuit, the first inverting amplifier/limiter circuit coupled between the second node of the first follower circuit and the third node of the first follower circuit, the first inverting amplifier/limiter circuit adapted to amplify and limit a signal at the third node of the first follower circuit;

a second oscillator sub-circuit adapted to operate at the upper frequency F2, the second oscillator sub-circuit including:
 a second tank circuit, the second tank circuit coupled to the resonator, the second tank circuit adapted to pass the upper frequency F2 and to block the lower frequency F1;
 a second follower circuit, the second follower circuit including a first node coupled to the second tank circuit, a second node, and a third node;
 a fourth tank circuit, the fourth tank circuit coupled between the second node of the second follower circuit and ground, the fourth tank circuit adapted to allow amplifier/limiter gain at the upper frequency F2 and to shunt the parasitic frequency F3 to ground; and
 a second inverting amplifier/limiter circuit, the second inverting amplifier/limiter circuit coupled between the second node of the second follower circuit and the third node of the second follower circuit, the second inverting amplifier/limiter circuit adapted to amplify and limit a signal at the third node of the second follower circuit.

11. The serial-type dual-mode oscillator of claim 10, wherein the first tank circuit and the fourth tank circuit each includes:
a first leg in parallel with a second leg;
wherein the first leg includes in series:
 a first capacitor; and
 a first inductor; and
wherein the second leg includes in series:
 a second capacitor; and
 a second resistor.

12. The serial-type dual-mode oscillator of claim 11, wherein, for the first tank circuit, a series combination of the first capacitor and the first inductor is adapted to resonate at the lower frequency F1; and
wherein, for the first tank circuit, a series combination of the first capacitor and the first inductor in parallel with the second capacitor is adapted to resonate at the upper frequency F2.

13. The serial-type dual-mode oscillator of claim 11,
wherein, for the fourth tank circuit, a series combination of the first capacitor and the first inductor is adapted to resonate at the parasitic frequency F3; and
wherein, for the fourth tank circuit, a series combination of the first capacitor and the first inductor in parallel with the second capacitor is adapted to resonate at the upper frequency F2.

14. The serial-type dual-mode oscillator of claim 10, wherein the second tank circuit and the third tank circuit each includes:
a first leg in parallel with a second leg;
wherein the first leg includes in series:
a first capacitor; and
a first inductor; and
wherein the second leg includes in series:
a second inductor; and
a second resistor.

15. The serial-type dual-mode oscillator of claim 14,
wherein, for the second tank circuit, a series combination of the first capacitor and the first inductor is adapted to resonate at the upper frequency F2; and
wherein, for the second tank circuit, a series combination of the first capacitor and the first inductor in parallel with the second capacitor is adapted to resonate at the lower frequency F1.

16. The serial-type dual-mode oscillator of claim 14,
wherein, for the third tank circuit, a series combination of the first capacitor and the first inductor is adapted to resonate at the parasitic frequency F3; and
wherein, for the third tank circuit, a series combination of the first capacitor and the first inductor in parallel with the second capacitor is adapted to resonate at the lower frequency F1.

17. The serial-type dual-mode oscillator of claim 14, wherein the second leg further includes a second capacitor in parallel with the second inductor.

18. The serial-type dual-mode oscillator of claim 10,
wherein each of the first follower circuit and the second follower circuit includes one of a bipolar transistor follower circuit, a metal oxide semiconductor field effect transistor (MOSFET) follower circuit, or a compound-transistor follower circuit; and
wherein the compound-transistor follower circuit includes:
a first MOSFET of a first type adapted to have an $M_{P1}=1$;
a second MOSFET of the first type adapted to have an $M_{P2}>1$; and
a third MOSFET of a second type opposite the first type.

19. The serial-type dual-mode oscillator of claim 10,
wherein the first inverting amplifier/limiter circuit and the second inverting amplifier/limiter circuit each includes a corresponding transimpedance amplifier; and
wherein one or more of the first tank circuit, the second tank circuit, the third tank circuit, or the fourth tank circuit includes a trimmable capacitor.

20. The serial-type dual-mode oscillator of claim 10, wherein the upper frequency F2 is within approximately 10% of the lower frequency F1 or the upper frequency F2 is an odd integer multiple of the lower frequency F1.

* * * * *